United States Patent
Huh

(10) Patent No.: US 11,145,085 B2
(45) Date of Patent: Oct. 12, 2021

(54) SYSTEMS AND METHODS FOR AUTOMATING INSTALLATION OF PREFABRICATED PARTS USING PROJECTED INSTALLATION GRAPHICS

(71) Applicant: Social Construct Company, San Francisco, CA (US)

(72) Inventor: Dae Young Huh, San Francisco, CA (US)

(73) Assignee: Social Construct Company, San Francisco, CA (US)

(*) Notice: Subject to any disclaimer, the term of this patent is extended or adjusted under 35 U.S.C. 154(b) by 109 days.

(21) Appl. No.: 16/714,360

(22) Filed: Dec. 13, 2019

(65) Prior Publication Data

US 2020/0242799 A1 Jul. 30, 2020

Related U.S. Application Data

(60) Provisional application No. 62/797,100, filed on Jan. 25, 2019.

(51) Int. Cl.
*G06T 7/73* (2017.01)
*G06F 30/13* (2020.01)
(Continued)

(52) U.S. Cl.
CPC ............... *G06T 7/74* (2017.01); *G06F 30/12* (2020.01); *G06F 30/13* (2020.01); *G06T 7/75* (2017.01);
(Continued)

(58) Field of Classification Search
CPC ....... G06T 17/05; G06T 7/0004; G06T 7/001; G06T 7/74; G06T 7/75;
(Continued)

(56) References Cited

U.S. PATENT DOCUMENTS

2012/0249741 A1* 10/2012 Maciocci .............. G06T 15/503 348/46
2015/0262421 A1* 9/2015 Bell ........................ G06T 17/20 345/423

(Continued)

OTHER PUBLICATIONS

The Electrical and Illuminating Equipment of the Eastman Theatre and School of Music (Year: 1923).*

*Primary Examiner* — Nizar N Sivji
(74) *Attorney, Agent, or Firm* — Cognition IP, P.C.; Edward Steakley

(57) ABSTRACT

A system and method for automating installation of prefabricated parts at a construction site includes retrieving an installation plan for a room in which a plurality of parts are installed. The method also includes determining an orientation of the room based on one or more images captured for the room and scanning a first visual indicator on a first part from the plurality of parts, the visual indicator indicating a first order position in the installation order. The method includes determining a first installation location in the room based on the first order position and the installation plan. The method also includes displaying an installation graphic at the first installation location in the room, the installation graphic illustrating a spatial position and an alignment for the first part.

20 Claims, 28 Drawing Sheets

(51) Int. Cl.
*H04N 5/74* (2006.01)
*G06F 30/12* (2020.01)

(52) U.S. Cl.
CPC . *H04N 5/7408* (2013.01); *G06T 2207/30204* (2013.01)

(58) Field of Classification Search
CPC ....... G06T 2207/30204; G06F 16/9537; G06F 16/587; G06F 30/13; G06F 30/12; H04N 9/3179; H04N 9/3185; H04N 9/3194; H04N 9/3147; H04N 7/181; H04N 5/23238; H04N 5/2252; H04N 9/3141; H04N 2201/0446; H04N 5/7408
See application file for complete search history.

(56) References Cited

U.S. PATENT DOCUMENTS

| | | | |
|---|---|---|---|
| 2016/0057400 A1* | 2/2016 | Winter | H04N 9/3185 348/745 |
| 2018/0121571 A1* | 5/2018 | Tiwari | G08B 27/005 |
| 2018/0283019 A1* | 10/2018 | Telleria | B05D 3/0413 |
| 2019/0005719 A1* | 1/2019 | Fleischman | G06T 7/73 |
| 2019/0266793 A1* | 8/2019 | Sheffield | G06T 17/05 |
| 2020/0024849 A1* | 1/2020 | Blumer | E04F 21/26 |

\* cited by examiner

SYSTEMS AND METHODS FOR AUTOMATING INSTALLATION OF PREFABRICATED PARTS USING PROJECTED INSTALLATION GRAPHICS

CROSS-REFERENCE TO RELATED APPLICATIONS

This application claims the benefit of U.S. Provisional Patent Application No. 62/797,100, filed Jan. 25, 2019, which is hereby incorporated by reference in its entirety.

FIELD

The present disclosure relates generally to methods and system for assisting in positioning of components at a construction site.

BACKGROUND

Presently, at a construction site, a user positions a structural or building component by relying on a blueprint made in a design department, or by decision made on the fly at the construction site. For each component to be positioned, the user references the blueprint and then positions the component.

This conventional positioning method requires a substantial amount of time, not only for preparing the blueprints, but especially for using them on the site. Further, this method also requires that the user have experience in using blueprints. Further, under the particularly difficult conditions of a building site, the reading of the blueprints and the taking of measurements often carried out by hand are sources of errors on the exact positioning of the components.

SUMMARY

In some implementations, a method for automating installation of prefabricated parts at a construction site includes retrieving an installation plan for a room in which a plurality of parts are installed. The installation plan includes an installation location for each of the plurality of parts and an installation order of the plurality of parts. Each of the plurality of parts may include a visual indicator indicating an order position in the installation order. The method may also include determining an orientation of the room based on one or more images captured for the room. Additionally, the method includes scanning a first part from the plurality of parts to determine a first order position in the installation order. In some embodiments, scanning the first part comprises scanning a first visual indicator on the first part from the plurality of parts, the visual indicator indicating a first order position in the installation order. The method further includes determining whether the first order position matches a current order position in the installation order. The method includes, in response to the first order position, matching the current order position, determining a first installation location in the room based on the first order position and the installation plan. The method also includes displaying an installation graphic, the installation graphic illustrating a spatial position and an alignment for the first part. In some embodiments, the installation graphic may be displayed at the first installation location in the room, such as by projection. In some embodiments, the installation graphic may be displayed at the first installation location in the room by augmented reality (AR), virtual reality (VR), or another virtual depiction of the room.

Additionally, in some implementations, a system for automating installation of prefabricated parts at a construction site includes one or more display systems and one or more cameras. The system also includes a processing unit coupled to the one or more display systems and the one or more cameras, the processing unit executing instructions for performing a method including retrieving an installation plan for a room in which a plurality of parts are installed. The installation plan includes an installation location for each of the plurality of parts and an installation order of the plurality of parts. Each of the plurality of parts may include a visual indicator indicating an order position in the installation order. The method also includes determining an orientation of the room based on one or more images captured by the one or more cameras for the room. Additionally, the method includes scanning, using the one or more cameras, a first part from the plurality of parts to determine a first order position in the installation order. In some embodiments, scanning the first part comprises scanning a first visual indicator on the first part from the plurality of parts, the visual indicator indicating the first order position in the installation order. The method further includes determining whether the first order position matches a current order position in the installation order. The method includes, in response to the first order position matching the current order position, determining a first installation location in the room based on the first order position and the installation plan. The method also includes displaying an installation graphic at the first installation location in the room, the installation graphic illustrating a spatial position and an alignment for the first part.

BRIEF DESCRIPTION OF THE DRAWINGS

The present disclosure will become better understood from the detailed description and the drawings, wherein.

DETAILED DESCRIPTION

Figure 1A:
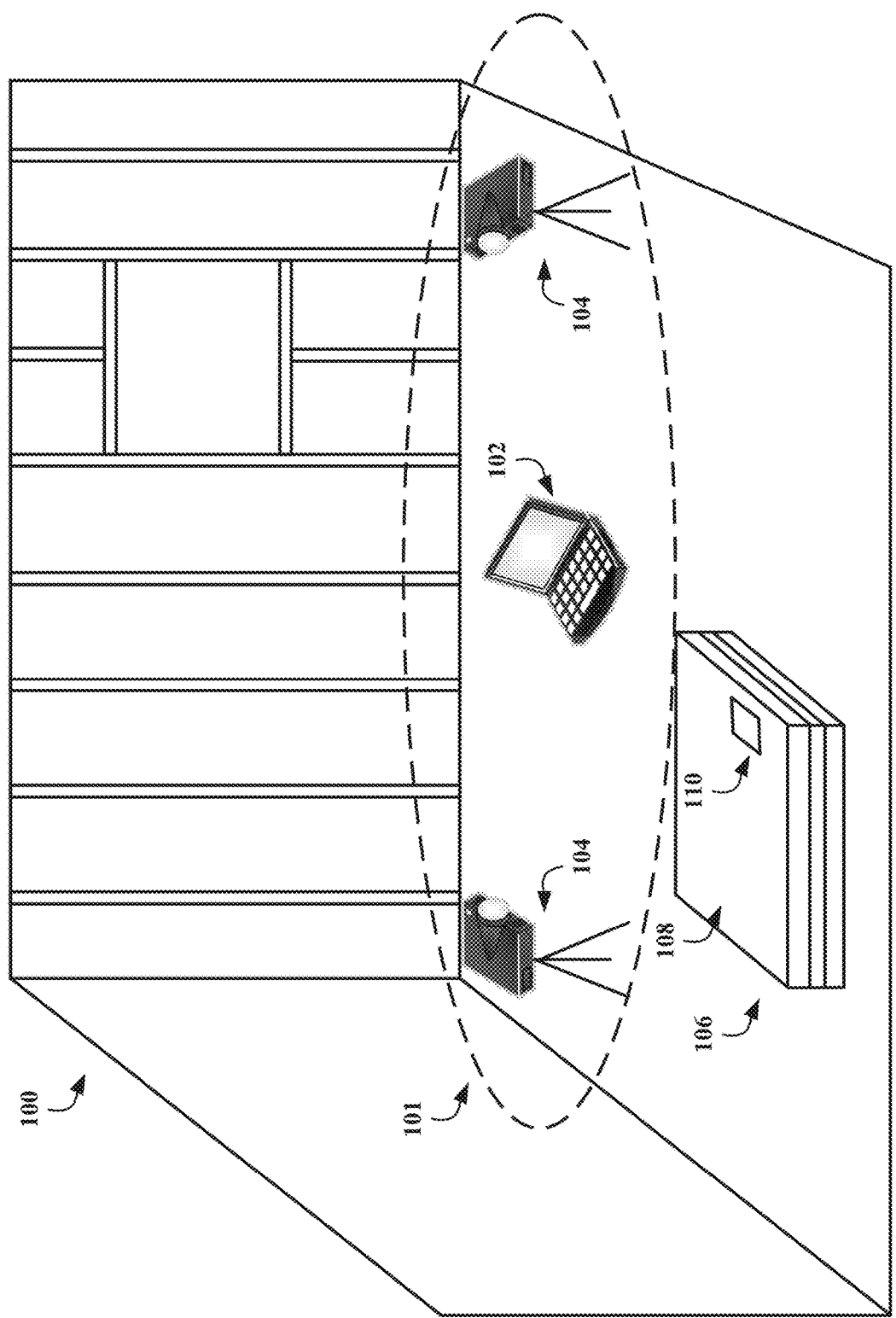
FIGS. 1A-1D illustrate a block diagram of an example of an example of a construction site including an installation assistance system 101, according to various implementations.

For simplicity and illustrative purposes, the principles of the present teachings are described by referring mainly to examples of various implementations thereof. However, one of ordinary skill in the art would readily recognize that the same principles are equally applicable to, and can be implemented in, all types of information and systems, and that any such variations do not depart from the true spirit and scope of the present teachings. Moreover, in the following detailed description, references are made to the accompanying figures, which illustrate specific examples of various implementations. Logical and structural changes can be made to the examples of the various implementations without departing from the spirit and scope of the present teachings. The following detailed description is, therefore, not to be taken in a limiting sense and the scope of the present teachings is defined by the appended claims and their equivalents.

In addition, it should be understood that steps of the examples of the methods set forth in the present disclosure can be performed in different orders than the order presented in the present disclosure. Furthermore, some steps of the examples of the methods can be performed in parallel rather than being performed sequentially. Also, the steps of the examples of the methods can be performed in a network environment in which some steps are performed by different computers in the networked environment.

Some implementations are implemented by a computer system. A computer system can include a processor, a memory, and a non-transitory computer-readable medium. The memory and non-transitory medium can store instructions for performing methods and steps described herein.

FIGS. 1A-1D are block diagrams illustrating an example of a construction site 100 in which an installation assistance system 101 can be used in various implementations. While FIGS. 1A-1D illustrate various components contained in the construction site 100, FIGS. 1A-1D illustrate one example of a construction site and additional components can be added and existing components can be removed.

The installation assistance system 101 includes a computer system 102 and one or more machine vision devices 104. The computer system 102 can be configured to communicate with the machine vision devices 104 to provide assistance in the installation of a queue 106 of one or more prefabricated parts ("prefab parts") 108. To assist in automated installation process, the prefab parts may include a visual indicator 110. The visual indicator 110 includes information about each of the prefab parts 108. For example, the visual indicator 110 can include the order position, in the installation order, for each of the prefab parts 108.

Figure 1B:
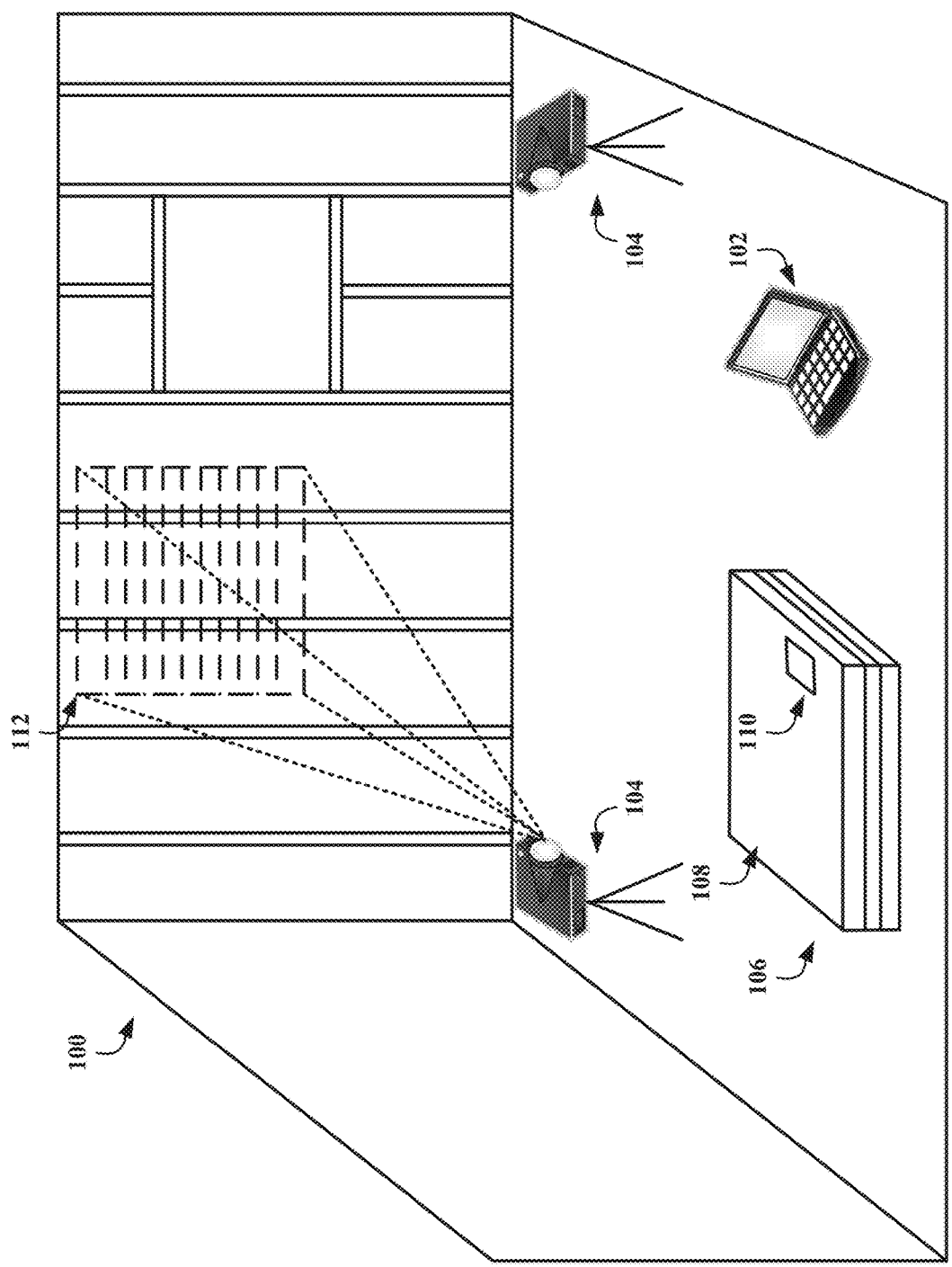

In implementations, the machine vision devices 104 include hardware and software that, in coordination with the computer system 102, identify installation locations for the queue 106 of the prefab parts 108 and provide visual assistance in installing the prefab parts 108. Machine vision devices 104 may comprise, for example, cameras. As illustrated in FIG. 1B, the computer system 102 operates in coordination with machine vision devices 104 to generate and display installation graphics 112. The installation graphics 112 operate as an installation guide for a user to install a prefab part 108. In implementations, the installation graphics 112 are visual representations of the prefab part 108 that allows a user to align the actual prefab part at the installation location to ensure proper installation of the prefab part 108.

In implementations, the computer vision aspect of the machine vision devices 104 may be separate from the display aspect of the machine vision devices 104. Two sets of devices may be provided, a first set for recording information about the scene and a second set for displaying information to guide installation. The recording devices may comprise cameras for scanning prefab parts. The cameras may be communicatively coupled to computer system 102 including computer vision software for scanning the prefab parts. The display devices may display information to allow users to align the prefab parts at the installation location to ensure proper installation of the prefab parts. Display devices may include projectors for displaying information in the room itself, AR systems such as headsets for providing an augmented reality display of information as if it was in the construction site 100, VR systems such as headsets for displaying information in a virtual environment, or computer displays of a virtual environment showing information about where to install the prefab parts. Recording devices may be separate from display devices and may be in entirely different locations. Reference to machine vision systems 104 herein should be understood to refer to either the recording aspect, display aspect, or both.

The computer system 102 may be connected over a network to remote computer systems. The computer system 102 may transmit information observed about the construction site 100, prefab parts 108, and installation locations to the remote computer systems. Remote computer systems may process or store the information. In some implementations, the remote computer systems may perform computer vision processing to identify the parts and determine their correct locations of installation and generate processed data that is transmitted back to the computer system 102 for display to a user via display devices such as machine vision devices 104.

In implementations, the installation assistance system 101 may be under the control or subject to interaction by users at the construction site. In implementations, the installation system 101 may be controlled or interacted with by gestures from a user. The gestures of a user may be recorded and interpreted by machine vision devices 104 using computer vision gesture control algorithms. In some embodiments, control of the installation assistance system 101 may be performed by detecting user interaction with a projected surface that is displayed by a projector. In some embodiments, control of the installation assistance system 101 may be performed through commands issued through computer system 102 such as by keyboard, mouse, or touchpad. In some embodiments, control of the installation assistance system 101 may be performed by detecting audio or voice commands from a user. The aforementioned control methods may be used to direct the installation assistance system 101 to move from one stage to another, turn on or off, or perform other commands.

In implementations, the queue 106 of the prefab parts 108 can be arranged in an installation order according to a predefined installation plan. The installation plan includes a three dimensional schematic of the construction site 100 and the location of any prefab parts 108 installed in the construction site 100. For example, the installation plan can be a computer-aided design ("CAD") model that provides a design outline for the construction site 100. The installation plan also includes an installation order for the prefab parts 108. The installation order can include a list of the prefab parts 108 to be installed and the order in which the prefab parts should be installed. According to the installation order, the prefab parts 108 can be arranged in the queue 106 according to the installation order. That is, the prefab parts 108 can be arranged in the queue 106 in a sequential order according to an order position of each of the prefab parts 108 so that the prefab parts 108 are removed from the queue 106 beginning with the first prefab part 108 to be installed.

Prior to the installation of the prefab parts 108, the installation plan can be generated by a user (architect, engineer, etc.) with the assistance of a computer system. For example, the installation assistance system 101 can be utilized to map the construction site 100 in order to design and select the installation locations for the prefab parts 108.

Likewise, for example, other types of surveying systems can be used to design and select the installation locations, such as a LIDAR system.

To assist in the automated installation process, the installation assistance system 101 determines the orientation of the construction site 100 in order to properly guide the installation of the queue 106 of prefab parts 108. The orientation of the construction site 100 includes the location and dimensions of the structures in the construction site 100, e.g., structural components, walls, doors. The orientation of the construction site 100 also includes the location of the machine vision devices 104 and the queue 106 of prefab parts 108.

In implementations, the computer system 102 instructs the machine vision devices 104 to scan the construction site 100. For example, the computer system 102 can be configured to instruct the machine vision devices 104 to project one or more predefined patterns around the construction site 100 and to capture one or more images and/or video of the projected patterns. The predefined patterns can include different reference patterns that can be analyzed to calculate and identify the dimensions and location in the construction site 100, such as a vertical line pattern, a horizontal line pattern, a grid pattern, and the like. The machine vision devices 104 can be configured to transmit the captured images and/or video to the computer system 102 for processing to determine the orientation of the construction site 100.

In implementations, the computer system 102 can be configured to perform image analysis algorithms and spatial analysis algorithms on the captured images and/or video to determine the orientation of the construction site 100. For example, when the predefined patterns are projected around the construction site 100, the shape and the positioning of the predefined pattern depend shape and dimensions of the structures in the construction site 100 and the relative position of the machine vision devices 104 to the structures. The computer system 102 can be configured to analyze the captured images and/or video, based on the known attributes of the predefined pattern that was projected, to determine the location of the machine vision devices 104. For example, the computer system 102 can store reference images of the predefined pattern projected at different distances. Based on the reference images, the computer system 102 can analyze the size and alteration of the predefined patterns in the captured images and/or videos that are caused by the projection of the predefined pattern in the construction site 100. From the analysis, the computer system 102 can calculate the orientation and position of the machine vision devices 104. Once the orientation and position of the machine vision devices 104 are calculated (e.g., the reference frame of the machine vision devices is determined), the computer system 102 can analyze the reference pattern in the predefined pattern in order to determine dimensions of the construction site.

Once the orientation of the construction site is determined, the computer system 102 can be configured to retrieve the installation plan and to map the location of the machine vision devices 104 to the installation plan. Based on this, as the prefab parts 108 are selected for installation, the computer system 102 can be configured to generate the installation graphics 112 that visually represent the prefab part 108 according to the installation location and the location of the machine vision devices. The, the computer system 102 can be configured to provide the installation graphics 112 to the machine vision device 104 and to instruct the machine vision devices 104 to display the installation graphics 112. The display of installation graphics 112 may be via projector, AR, VR, or display in a virtual space on a computer.

When projection is used, in addition to generating the installation graphics 112 that represent the prefab part 108, the computer system 102 can be configured to determine and to select which of the one or more machine vision devices 104 to display installation graphics 112. For example, the computer system 102 can be configured to determine and to select one or more of the machine vision device 104 in order to provide a quality projection of the installation graphics 112 and to avoid interference with a user installing the prefab part 108. For instance, the computer system 102, in cooperation with the machine vision devices 104, can be configured to determine a location of the user installing the prefab part 108 and to select one or more of the machine vision devices 104 that avoid interference with the user.

Figure 1C:
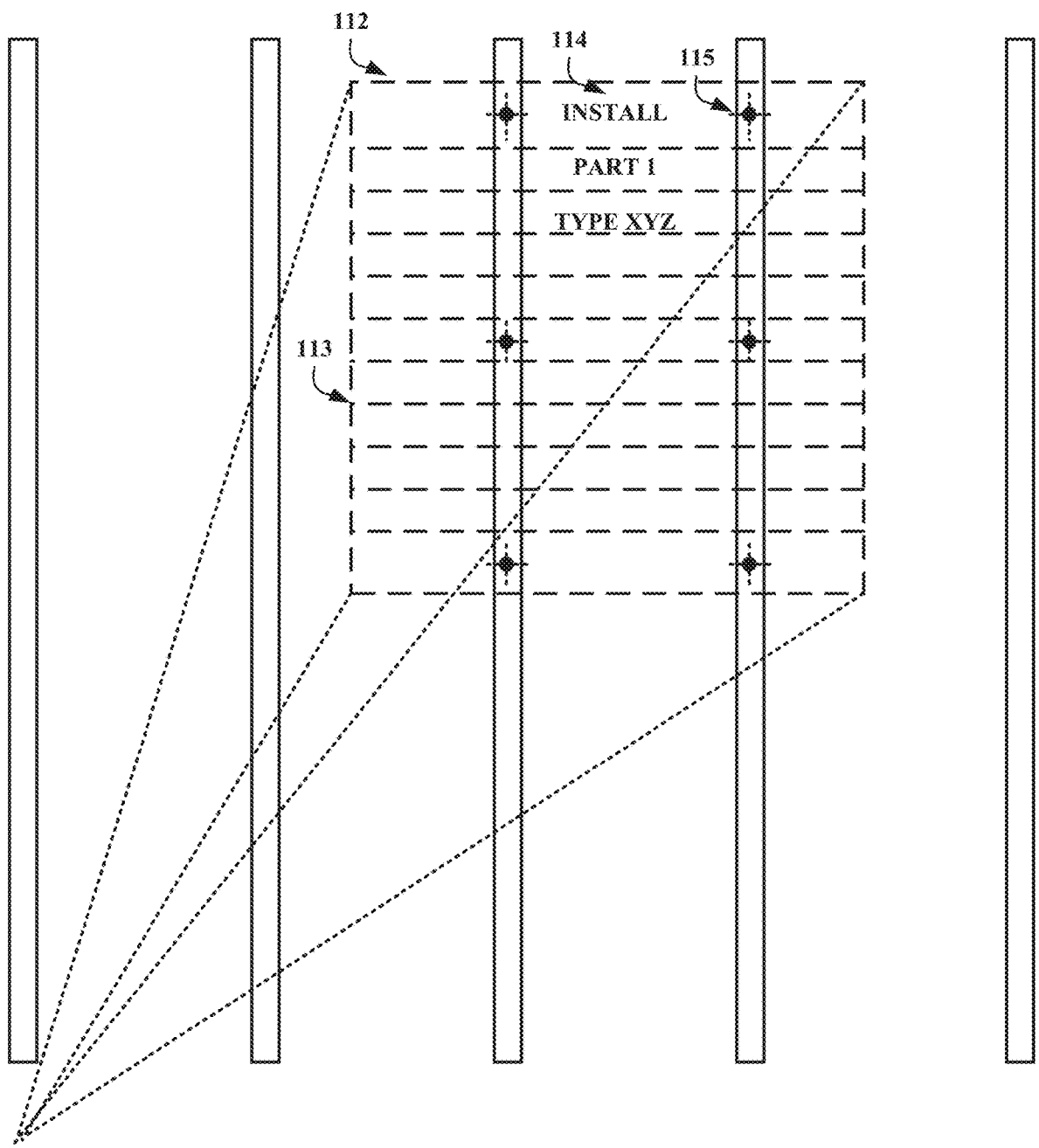

As illustrated in FIG. 1C, the installation graphics 112 include one or more visual reference lines 113 that provide a reference for aligning the prefab parts 108. For example, the visual reference lines 113 can include one or more lines that mirror the outline of the prefab part 108 and one or more reference lines that can provide reference for ensuring correct alignment of the prefab part 108. The installation graphics 112 can also include visual text 114 to provide information on the installation procedure, provide instructions on the installation procedure, and provide information on the prefab part 108 to be installed. For example, the visual text 114 can include text such as the action to be taken by the user, e.g., install, and information on the prefab part 108, e.g., order number in the queue 106 and prefab part type. The installation graphics 112 can also include one or more connector visualization 115. For example, the connector visualization 115 can provide a reference to identify the location and placement of connectors such as screws, bolts, nails, hanging rails, adhesive, etc.

Figure 1D:
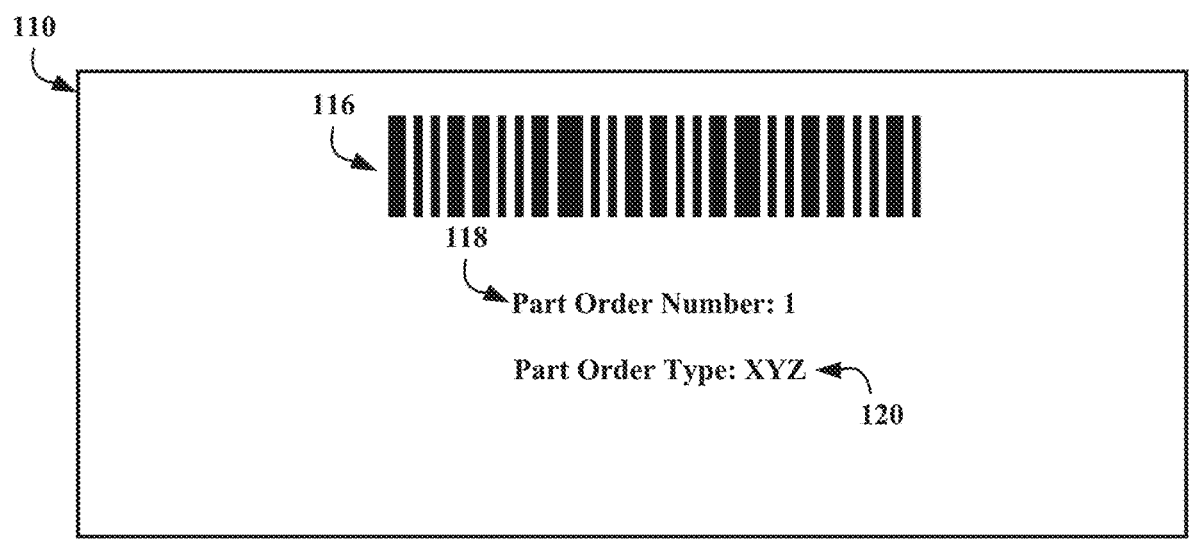

To identify which prefab part 108 has been selected for installation, each of the prefab parts 108 may include the visual indicator 110. As illustrated in FIG. 1D, the visual indicator 110 includes a machine-readable label 116 that encodes information on the prefab part 108, such as the order position in the installation order, the type of the prefab part 108, etc. In some implementations, the machine-readable label 116 can include a barcode, a quick response ("QR") code, a radio frequency identifier ("RFID"), etc. The installation assistance system 101 can utilize the machine vision device 104 to read the machine-readable label 116. The visual indicator 110 can also include text label 118 and 120 that provide a human-readable version of the information encoded in the machine-readable label 116.

In implementations, the prefab parts 108 can be any type of building part or material that is installed at the construction site 100. For example, the prefab parts 108 can include structural components (e.g., stubs, joists, rafters, doors and door frames, windows and window frames, etc.), facades (e.g., wall panels or coverings, flooring, ceiling panels or coverings, etc.), mechanical and electrical systems (e.g., plumbing pipes and fixtures, electrical wiring and fixtures, HVAC conduit and fixtures, etc.)

In some implementations, the computer system 102 and the machine vision devices 104 can be connected with a wired connection, e.g., physical cable. In some implementations, the computer system 102 and the machine vision devices 104 can be connected with a wireless connection, e.g., Bluetooth. Additionally, the computer system 102 can electronically communicate with the machine vision devices 104 and other computer system via one or more networks.

The one or more networks can include local area networks (LANs), wide area networks (WANs), telephone networks, such as the Public Switched Telephone Network (PSTN), an intranet, the Internet, or a combinations thereof. It should be understood that where the terms server or computer system are used, this includes the use of networked arrangements of multiple devices operating as a server or computer system. For example, distributed or parallel computing can be used.

The computer system 102 can be any type of computer system capable of communicating with and interacting with the machine vision devices 104 and performing the process and methods described herein. As described herein, the computer system 102 can include any of a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise).

In implementations, one or more of the components of the computer system 102 and the machine vision devices 104 can be implemented as software programs or modules that perform the methods, process, and protocols described herein. The software programs or modules can be written in a variety of programming languages, such as JAVA, C++, Python code, Visual Basic, hypertext markup language (HTML), extensible markup language (XML), and the like to accommodate a variety of operating systems, computing system architectures, etc.

In implementations, the computer system 102 is connected to remote computer systems via wired connection or wireless connection. The remote computer systems can include any of a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise). The remote computer systems may perform processing associated with any of the methods herein.

Figure 2:
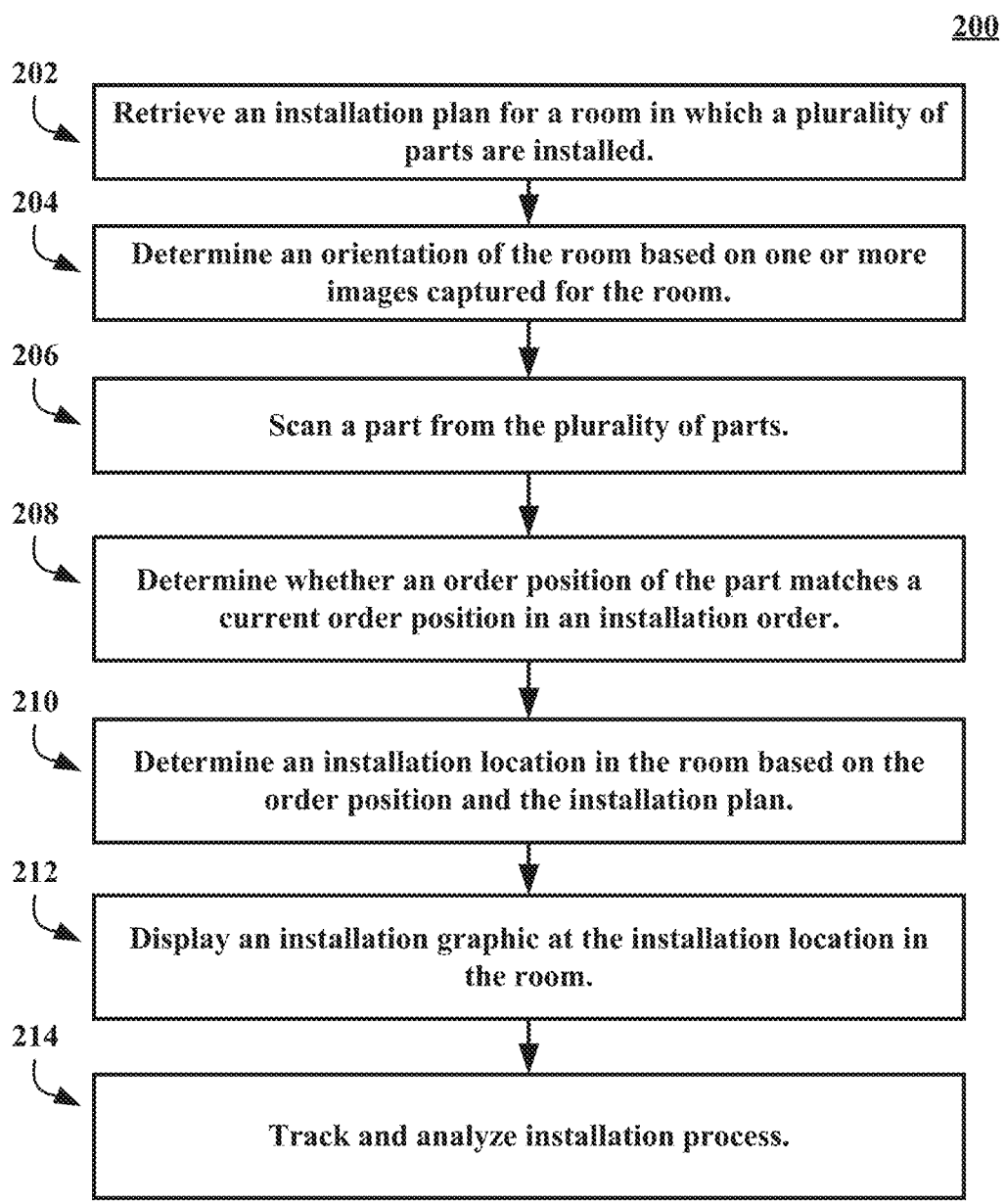
FIG. 2 illustrates an example of a method for providing automated assistance in installing parts at a construction site, according to various implementations.

FIG. 2 illustrates an example of a method 200 for providing automated assistance in installing parts at a construction site, according to various implementations. While FIG. 2 illustrates various stages that can be performed, stages can be removed and additional stages can be added. Likewise, the order of the illustrated stages can be performed in any order.

In 202, an installation plan is retrieved for a room in which a plurality of parts are installed. In some implementations, the installation plan includes an installation location for each of the plurality of parts and an installation order of the plurality of parts. For example, referring to FIG. 1A, the computer system 102 can be instructed to retrieve the installation plan for the construction site 100. In some implementations, the computer system 102 can locally store the installation plan. In some implementations, the computer system 102 can retrieve the installation plan from remote storage via a network.

In 204, an orientation of the room is determined based on one or more images captured for the room. In some implementations, the one or more images can be still images. In some implementations, the one or more images can be video images. For example, referring to FIG. 1A, the computer system 102 can instruct the machine vision devices 104 to project one or more predefined patterns around the construction site 100 and to capture one or more images for the room. The machine vision devices 104 can transmit the one or more images captured for the room to the computer system 102 for processing to determine the orientation of the construction site 100. One received, the computer system 102 can perform image analysis algorithms and spatial analysis algorithms on the one or more images captured for the room to determine the orientation of the room.

In some implementations, the computer system 102 can analyze the one or more images captured for the room, based on the known attributes of the predefined pattern that was projected, to determine the location of the machine vision devices 104. For example, the computer system 102 can store reference images of the predefined pattern projected at different distances. Based on the reference images, the computer system 102 can analyze the size and alteration of the predefined patterns in the one or more images captured for the room that are caused by the projection of the predefined pattern in the construction site 100. From the analysis, the computer system 102 can calculate the orientation and position of the machine vision devices 104. Once the orientation and position of the machine vision devices 104 are calculated (e.g., the reference frame of the machine vision devices is determined), the computer system 102 can analyze reference patterns in the predefined pattern in order to determine dimensions of the room.

In 206, a part from the plurality of parts is scanned. In some implementations, the entire part or a portion of the part is scanned such as by a camera, and the part is recognized based on object recognition. Object recognition may be performed by a machine learning algorithm by comparison of the image of the part to a stored database of parts or by use of a machine learning classifier. Once the part is identified, an order position may be retrieved based on the order of installation of the part in the installation plan. In some implementations, scanning a part is performed by scanning a visual indicator on the part. The visual indicator indicates an order position in the installation order. In some implementations, the visual indicator can include a machine-readable label. In some implementations, the visual indicator can include a human-readable label. For example, referring to FIG. 1A, the installation assistance system 101 can utilize the machine vision device 104 to read the machine-readable label 116 of the visual indicator 110. In some embodiments, parts are continuously scanned without needing user input to trigger the scanning. In some embodiments, parts are automatically scanned when they are removed from queue 106. In some embodiments, parts are automatically scanned while in the queue 106.

In 208, it is determined whether the order position matches a current order position in an installation order. In some implementations, the order position read from the visual indicator can be compared to the current order position from installation plan. For example, referring to FIG. 1A, as the prefab parts 108 are installed, the computer system 102 can record and track the prefab parts that have been installed and the current position in the installation order. In some implementations, if the order position does not match the current order position, the user can be instructed to select the correct prefab part that matches current order position. For example, referring to FIG. 1A, the computer system 102, in cooperation with machine vision device 104, can provide a visual warning and/or audio to the user that the selected prefab part does not match the installation order and provide a notice to select a new prefab part, which can include an identification of the prefab part to select.

In some implementation, if the order position does not match the current order position, the user can proceed with the installation, and the computer system 102, in cooperation with machine vision device 104, can provide missing graphics to visual represent the location of one or more of the missing prefab parts 108, in addition to the installation graphics for the prefab part 108 selected.

In 210, an installation location in the room is determined based on the order position and the installation plan. In some implementations, the installation assistance system determines the installation position from the installation plan based on the prefab parts order position. In some implementation, based on the location, the installation assistance system generates installation graphics that accurately represent the prefab part being installed. For example, once the orientation of the construction site is determined, the computer system 102 can retrieve the installation plan and to map the location of the machine vision devices 104 to the installation plan. Based on this, as the prefab parts 108 are selected for installation, the computer system 102 can generate the installation graphics 112 that visually represent the prefab part 108 according to the installation location and the location of the machine vision devices. The, the computer system 102 can provide the installation graphics 112 to the machine vision device 104 and instruct the machine vision devices 104 to display the installation graphics 112. In implementations, if the part selected is incorrect based on the installation plan, the installation assistance system may automatically adjust the installation process to allow for installation to continue. The system may adjust to deal with missing parts or parts that are out of order. The system modify the installation plan to skip over the missing part. In software, it may move the missing part to a missing part queue to be installed later. The system may assign the current order position in the installation plan to the currently selected part so that the user may continue with installation of the part without disrupting the installation of other parts.

In 212, an installation graphic is displayed at an installation location in the room. In some implementations, the installation assistance system displays the installation graphics at the installation location using the one or more machine vision devices. For example, as illustrated in FIG. 1B, the computer system 102 operates in coordination with machine vision devices 104 display installation graphics 112. The installation graphics 112 operate as an installation guide for a user to install a prefab part 108. The installation graphics 112 are visual representations of the prefab part 108 that allows a user to align the actual prefab part at the installation location to ensure proper installation of the prefab part 108.

For example, as illustrated in FIG. 1C, the installation graphics 112 include one or more visual reference lines 113 that provide a reference for aligning the prefab parts 108. For example, the visual reference lines 113 can include one or more lines that mirror the outline of the prefab part 108 and one or more reference lines that can provide reference for ensuring correct alignment of the prefab part 108. The installation graphics 112 can also include visual text 114 to provide information on the installation procedure, provide instructions on the installation procedure, and provide information on the prefab part 108 to be installed. For example, the visual text 114 can include text such as the action to be taken by the user, e.g., install, and information on the prefab part 108, e.g., order number in the queue 106 and prefab part type. The installation graphics 112 can also include one or more connector visualization 115. For example, the connector visualization 115 can provide a reference to identify the location and placement of connectors such as screws, bolts, nails, hanging rails, adhesive, etc.

In some implementations, the installation assistance system can select the machine vision device that provides an optimal projection of the installation graphics. For example, the computer system 102 can determine and select which of the one or more machine vision devices 104 to display installation graphics 112. For instance, the computer system 102 can determine and select one or more of the machine vision device 104 in order to provide a quality projection of the installation graphics 112 and to avoid interference with a user installing the prefab part 108. The computer system 102, in cooperation with the machine vision devices 104, can determine a location of the user installing the prefab part 108 and select one or more of the machine vision devices 104 that avoid interference with the user. In other embodiments, machine vision devices 104 display the installation graphics 112 using AR, VR, or a virtual display of the construction site on a computer system.

In 214, the installation process can be tracked and analyzed. In some implementations, when the installation begins, the installation assistance system can record images and/or video of the installation process. In some implementations, the installation assistance system can also record other data associated with the installation process, e.g., the order in which the prefab part were installed, which machine vision devices projected the installation graphics, any alteration required to the prefab parts. In some implementations, the installation assistance system can also scan the room after all parts have been installed to determine if parts are missing, if the prefab parts were installed correctly, etc.

For example, once the installation process begins, the computer system 102 can instruct the one or more machine vision devices 104 to record images and/or video of the installation process. The computer system 102 can coordinate the recording by switching recording between the machine vision devices 104 based which of the machine vision devices are displaying installation graphics and the location of the user. The computer system 102 can locally or remotely store the recorded video. Additionally, the computer system 102 can record other information relevant to the installation process. For example, if a user selects an incorrect part, the computer system 102 can record an identification of the incorrect part selected and identification of parts that were skipped or missing.

Additionally, the computer system 102 can record whether the user correctly installed the prefab parts 108. For example, after a user installs a prefab part, the computer system 102, in coordination with the machine vision devices 104, can scan the installed part, compare the installation to the location stored in the installation plan, and record the result.

The computer system 102 can utilize the tracking of the installation process in order to improve the installation assistance system 101. For example, the computer system 102 can track the amount of time it requires a user to install individual prefab parts 108 or the overall installation time and compare the amount of time to a predicted amount of time. The computer system 102 can then provide feedback to the user on ways to improve the installation process. Likewise, the computer system 102 can analyze the amount of time required for the installation process to determine if a more optimal installation ordering can be used.

Likewise, for example, the computer system 102 can analyze video of the user installing an individual prefab part 108 and compare the video to a video of a template installation process. Based on the analysis, the computer system 102 can provide feedback to the user on how to improve installation of an individual prefab part 108.

Additionally, for example, the computer system 102 can analyze the other information recorded such as missing parts, incorrect order selection, etc. For example, the computer system 102 can identify that a prefab part 108 was placed in the queue 106 out of order and provide feedback to the system or user that create the queue. Additionally, for example, the computer system 102 can analyze the image and/or video of the projected installation graphics to determine if the generation of the installation graphics can be improved.

Figure 3A:
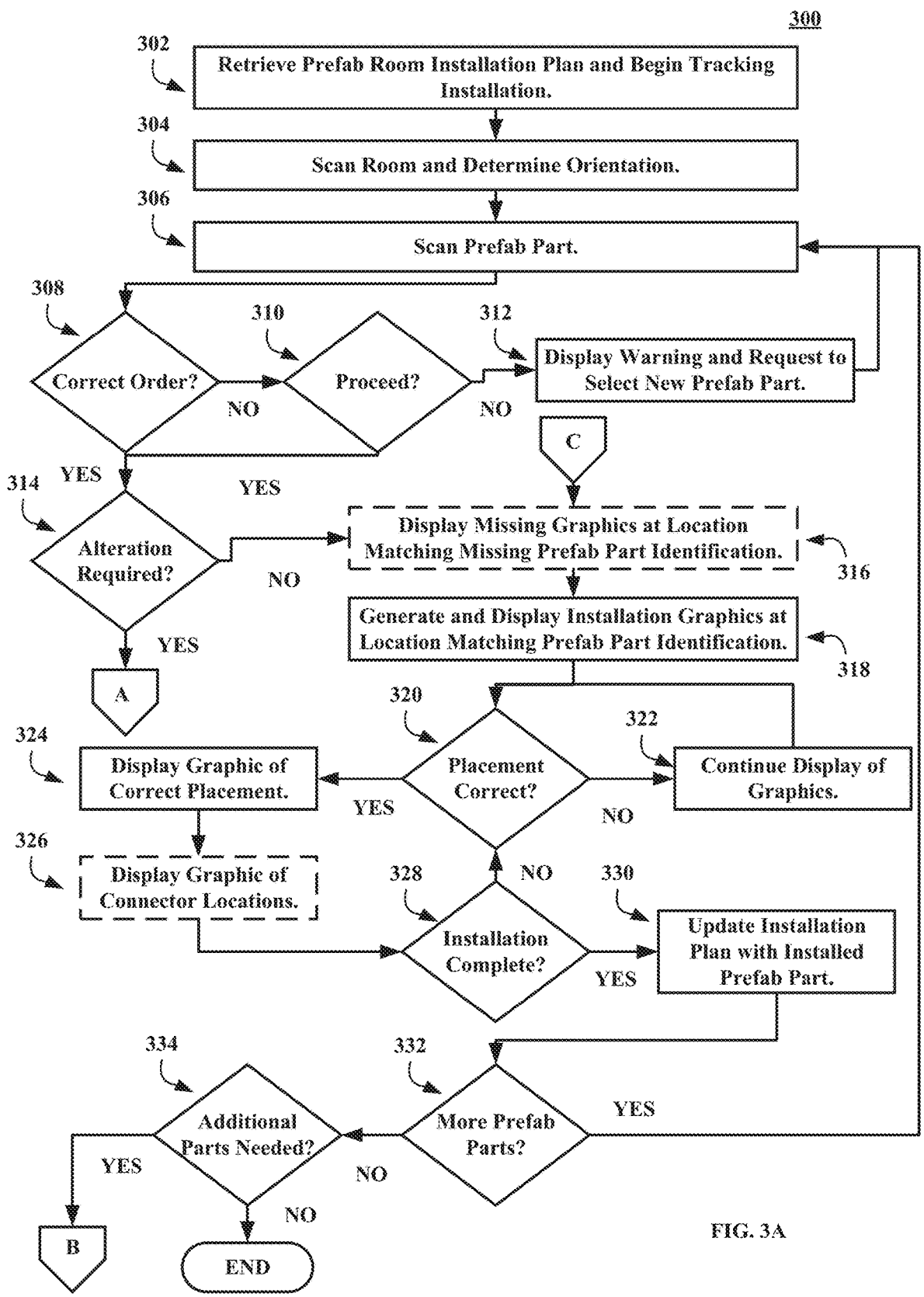
FIGS. 3A, 3B, and 4A-4J illustrate another example of a method for providing automated assistance in installing parts at a construction site, according to various implementations.
Figure 3B:
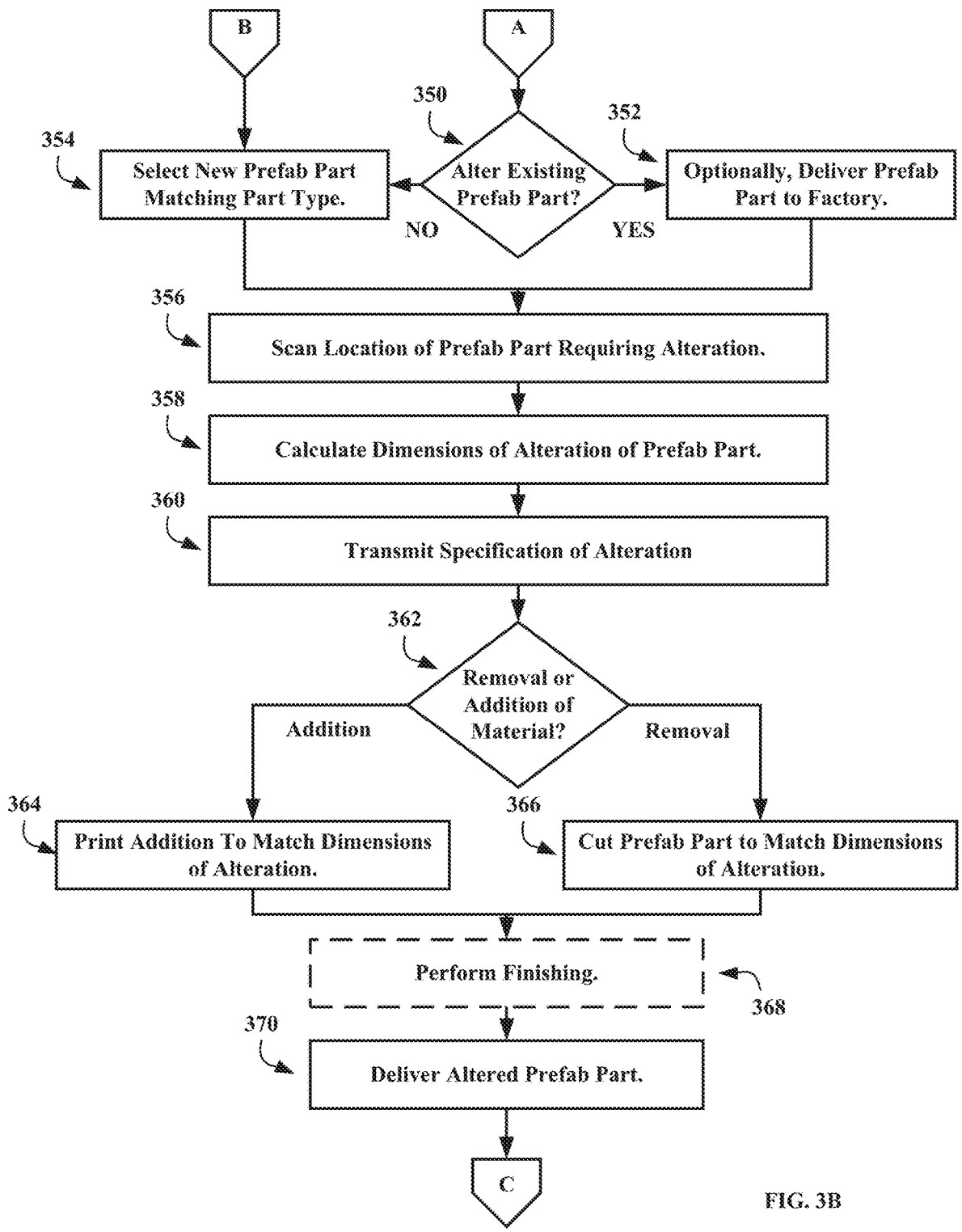

FIGS. 3A and 3B illustrate an example of a method 300 for providing automated assistance in installing parts at a construction site, according to various implementations. While FIGS. 3A and 3B illustrates various stages that can be performed, stages can be removed and additional stages can be added. Likewise, the order of the illustrated stages can be performed in any order.

In 302, a prefab room installation plan is retrieved and tracking an installation begins. In some implementations, the installation plan includes an installation location for each of the plurality of parts and an installation order of the plurality of parts. In some implementations, when the installation begins, the installation assistance system can record images and/or video of the installation process. In some implementations, the installation assistance system can also record other data associated with the installation process, e.g., the order in which the prefab part were installed, which machine vision devices projected the installation graphics, any alteration required to the prefab parts.

In 304, a room is scanned and an orientation of the room is determined. In some implementations, one or more predefined patterns are projected in the room and one or more images of the room are captured by the machine vision devices. In some implementations, the one or more images can be still images. In some implementations, the one or more images can be video images.

Figure 4A:
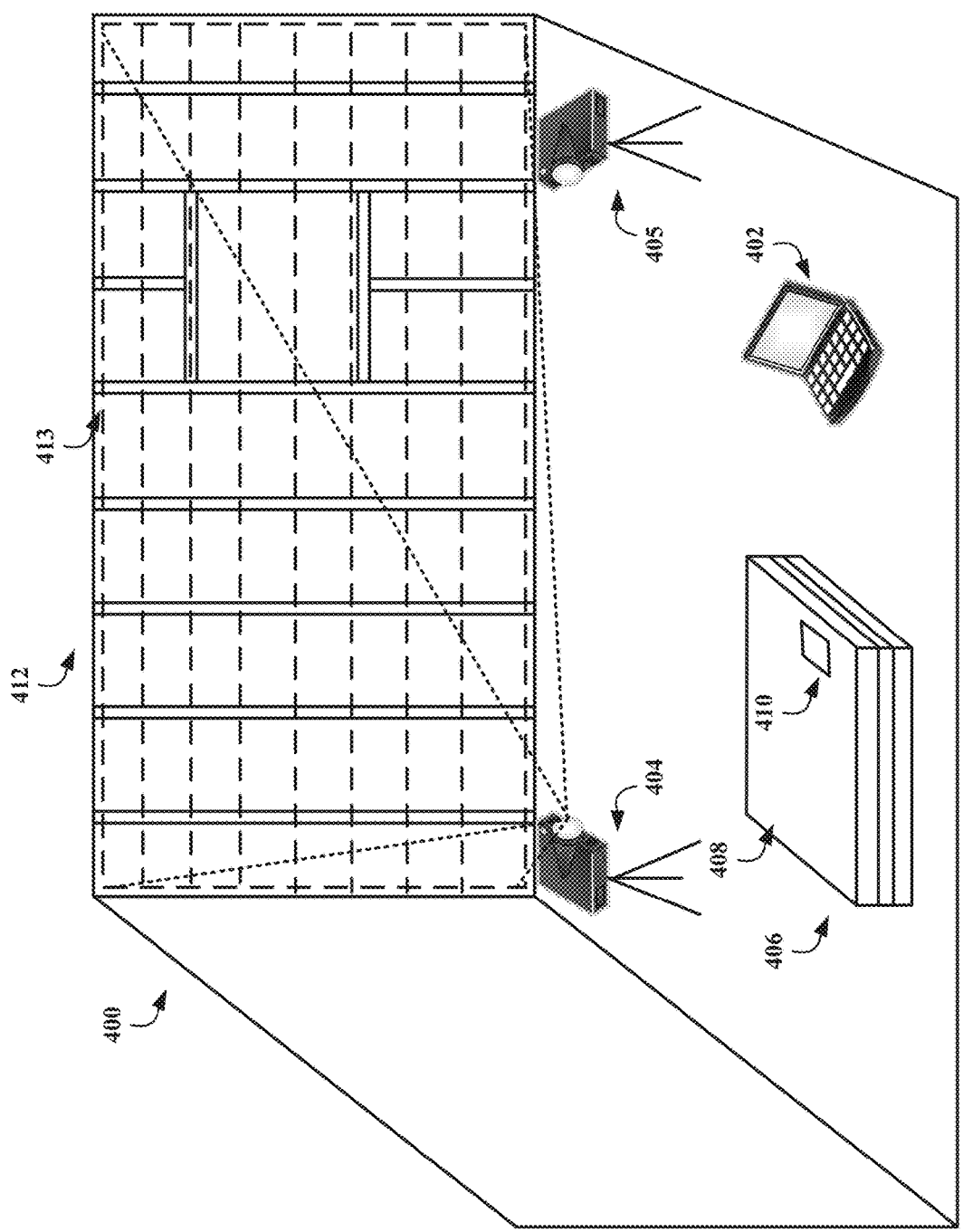
Figure 4B:
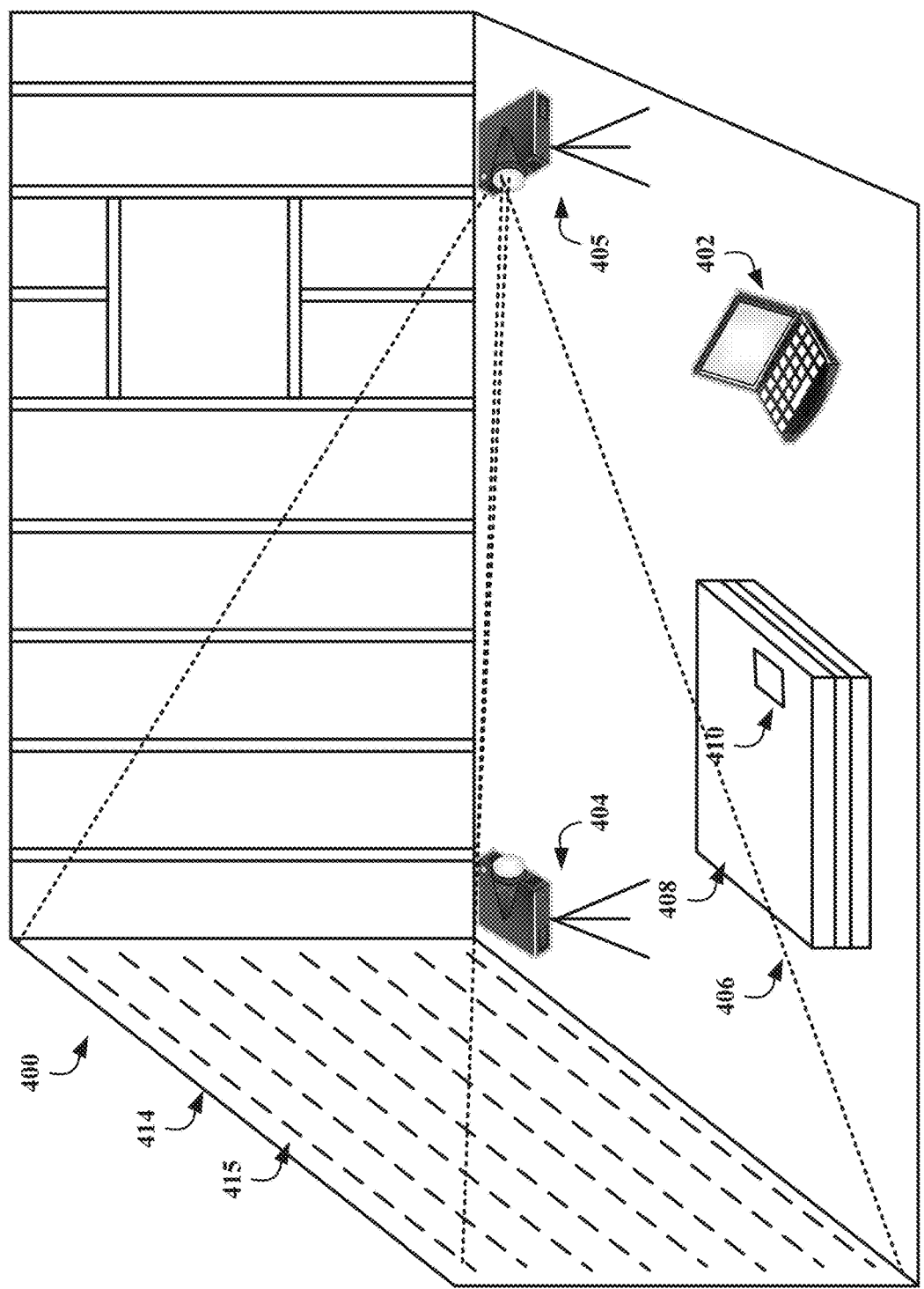

For example, FIGS. 4A-4J illustrate the automated assistance provide by an installation assistance system, including a computer system 402 and machine vision devices 404 and 405, when installing a queue 406 of prefab panels 408, which include visual indicators 410. As illustrated in FIG. 4A and FIG. 4B, the machine vision device 404 and the machine vision device 405 can scan a room 400. The machine vision device 404 can scan wall 412, and the machine vision device 405 can scan wall 414. To scan the room 400 and determine orientation, the machine vision device 404 can project a pattern 413 on the wall 412. While projecting the pattern 413 on the wall 412, the machine vision device 404 can capture images and/or a video of the pattern 413 on the wall 412. Likewise, the machine vision device 405 can project a pattern 415 on the wall 414. While projecting the pattern 415 on the wall 414, the machine vision device 405 can capture images and/or a video of the pattern 415 on the wall 414. Then, the machine vision device 404 and the machine vision device 405 can transmit the images and/or videos to the computer system 402 to determine the orientation of the room.

The computer system 402 can analyze the one or more images captured for the room, based on the known attributes of the predefined pattern that was projected, to determine the location of the machine vision devices 404 and 405. For example, the computer system 402 can store reference images of the pattern 415 projected at different distances. Based on the reference images, the computer system 402 can analyze the size and alteration of the pattern 415 in the one or more images captured for the room that are caused by the projection of the pattern 415 in the room 400. From the analysis, the computer system 402 can calculate the orientation and position of the machine vision devices 404 and 405. Once the orientation and position of the machine vision devices 404 and 405 are calculated (e.g., the reference frame of the machine vision devices is determined), the computer system 402 can analyze reference patterns in the predefined pattern in order to determine dimensions of the room.

In 306, a prefab part is scanned. In some implementations, this may be performed by scanning the part itself and performing object detection. An order position in an installation order may be determined based on determination of the part. In some implementations, this may be performed by scanning a prefab part identification. In some implementations, the prefab part identification can include a visual indicator. In some implementations, the visual indicator indicates an order position in the installation order. In some implementations, the visual indicator can include a machine-readable label. In some implementations, the visual indicator can include a human-readable label. In some embodiments, the installation assistance system can utilize the machine vision devices to scan the prefab part identification.

Figure 4C:
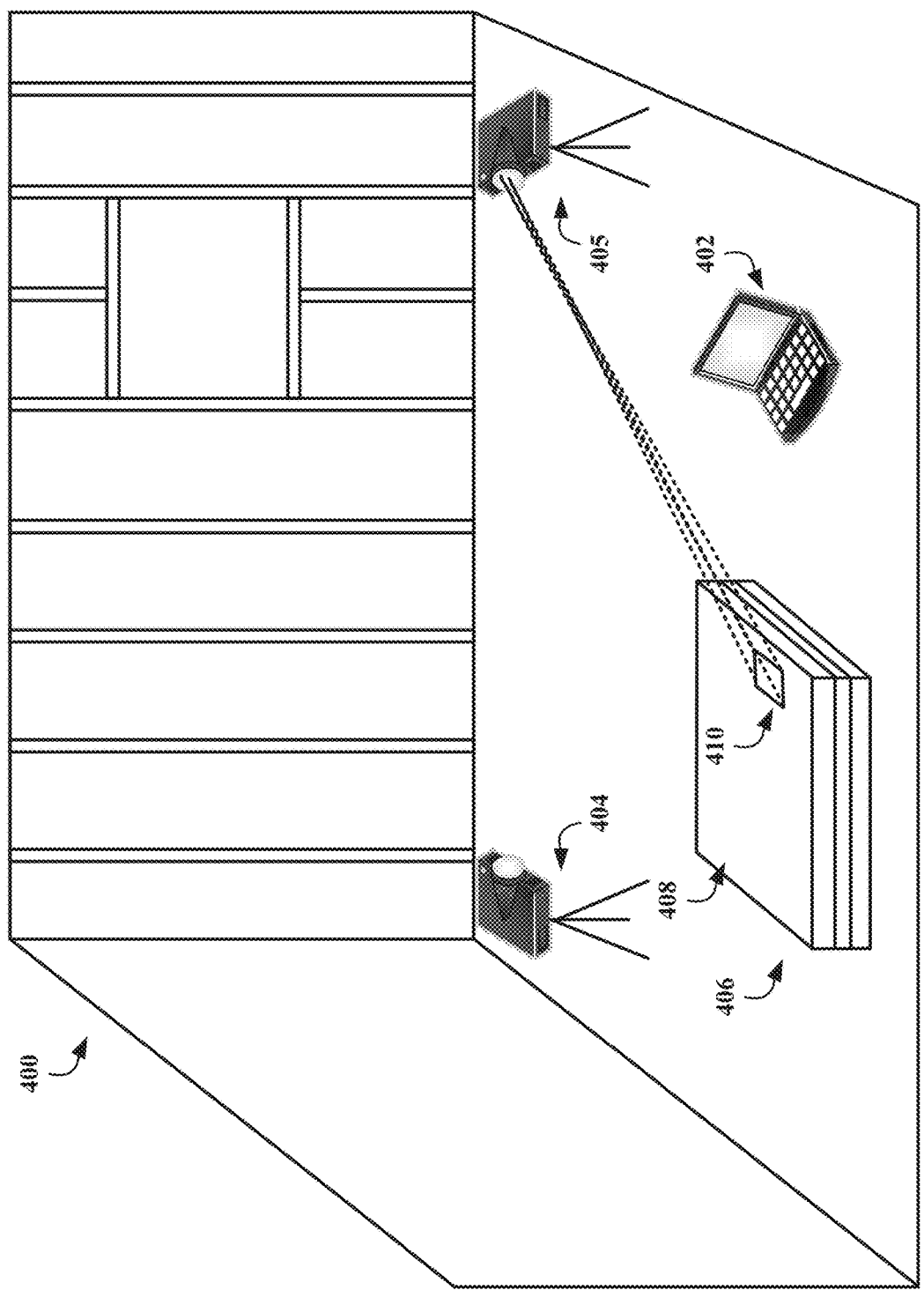
Figure 4D:
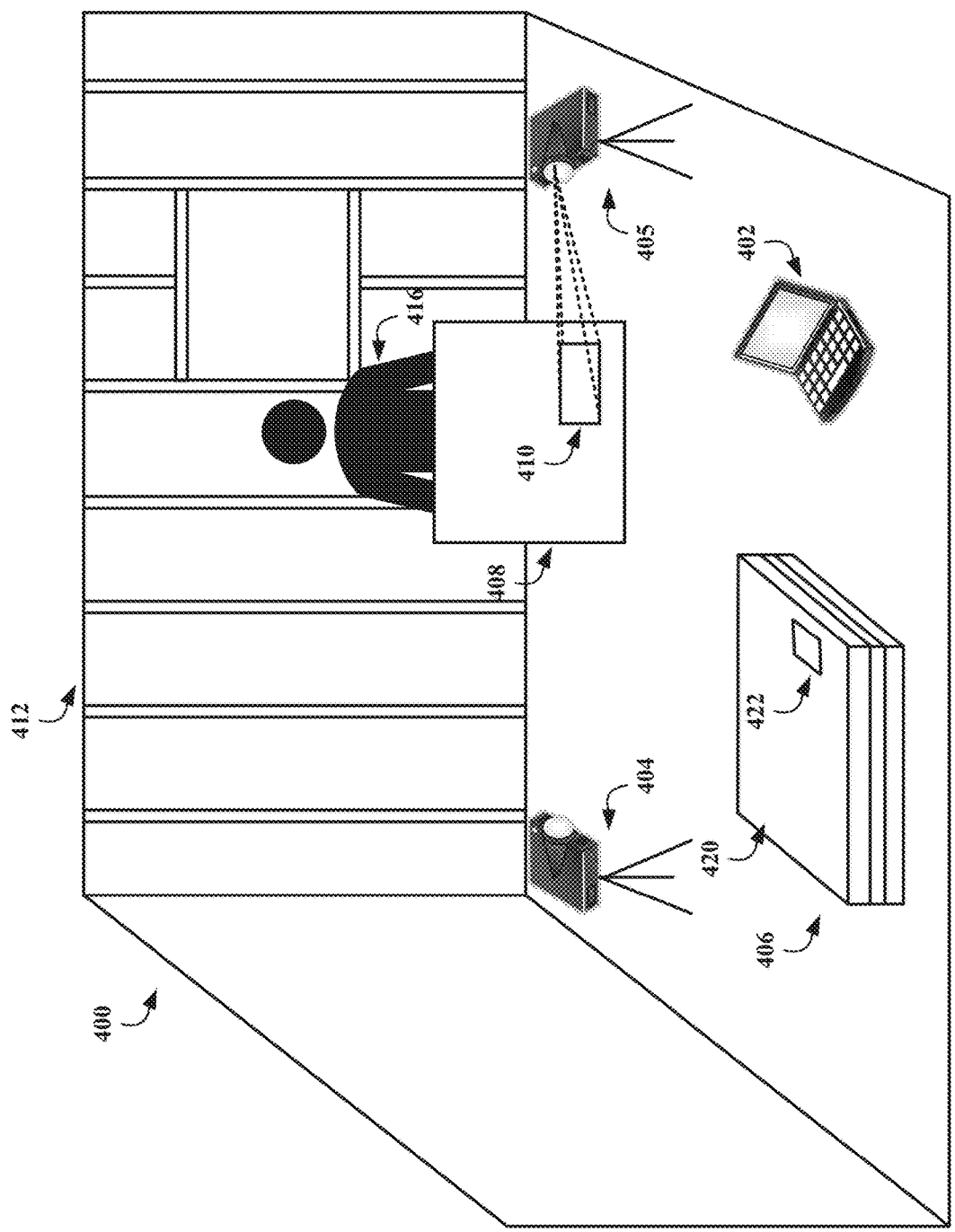

For example, as illustrated in FIG. 4C, the machine vision device 405 can scan the room 400 to locate and read the visual indicator 410 affixed to the prefab panel at the top of the queue 406. Likewise, as illustrated in FIG. 4D, a user 416 can position a prefab panel 408 near the machine vision device 405 in order to scan and read the visual indicator 410.

In 308, it is determined whether the order is correct. In some implementation, the order position read from the visual indicator can be compared to the current order position from the installation plan. In 310, if the order is not correct, it is determined whether to proceed with installation of the prefab part. For example, the installation assistance system can determine if the missing part is required to be installed prior to installation the prefab part that was selected. In 312, a warning and request to select a new prefab part is displayed and the method 300 returns to 306. In some implementations, if the order position does not match the current order position, the user can be instructed to select the correct prefab part that matches current order position, For example, the computer system 402, in cooperation with machine vision devices 404 and 405, can provide a visual warning and/or audio to the user that the selected prefab part does not match the installation order and provide a notice to select a new prefab part, which can include an identification of the prefab part to select. In some implementations, the system may determine to proceed even when the order position does not match the current order position. The system may adjust the installation plan to skip over missing parts and allow installation to continue with the currently selected prefab part. The missing part may be moved to a later part of the installation plan.

If the order is correct or it is determined to proceed, in 314, it is determined whether alteration to the prefab part is required. If alteration is required, the method 300 proceeds to 350 (illustrated in FIG. 3B and described below.) For example, based on the installation location, the prefab part may require alteration to fit in the installation location. For example, when the computer system 402 determines the installation location, the computer system 402 can determine that the prefab part will overlap another prefab part or structural component in the room 400. Likewise, the computer system 402 can determine that the prefab part will not correctly fill in the installation space size. The alteration required can occur due to any number of factors such as manufacturing tolerances, errors in the installation plan, predetermined alteration, etc.

If alteration is not required, in 316, missing graphics can optionally be displayed at the location matching a missing prefab part identification. In some implementations, if the installation proceeds with an out of order prefab part, the installation assistance system can display missing graphics in order to assist with the installation of the out of order part and ensure that the missing prefab part can be installed later.

Figure 4E:
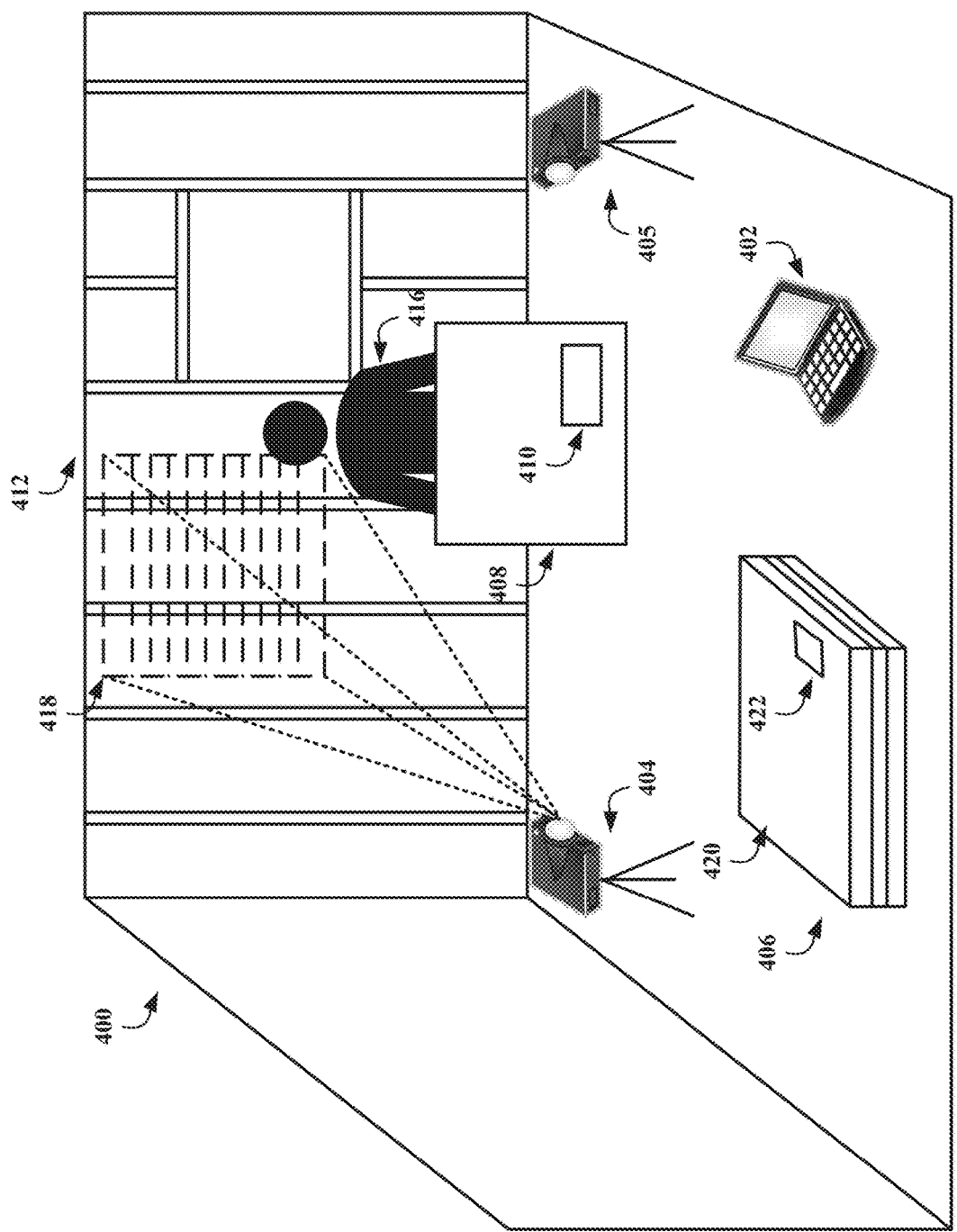
Figure 4F:
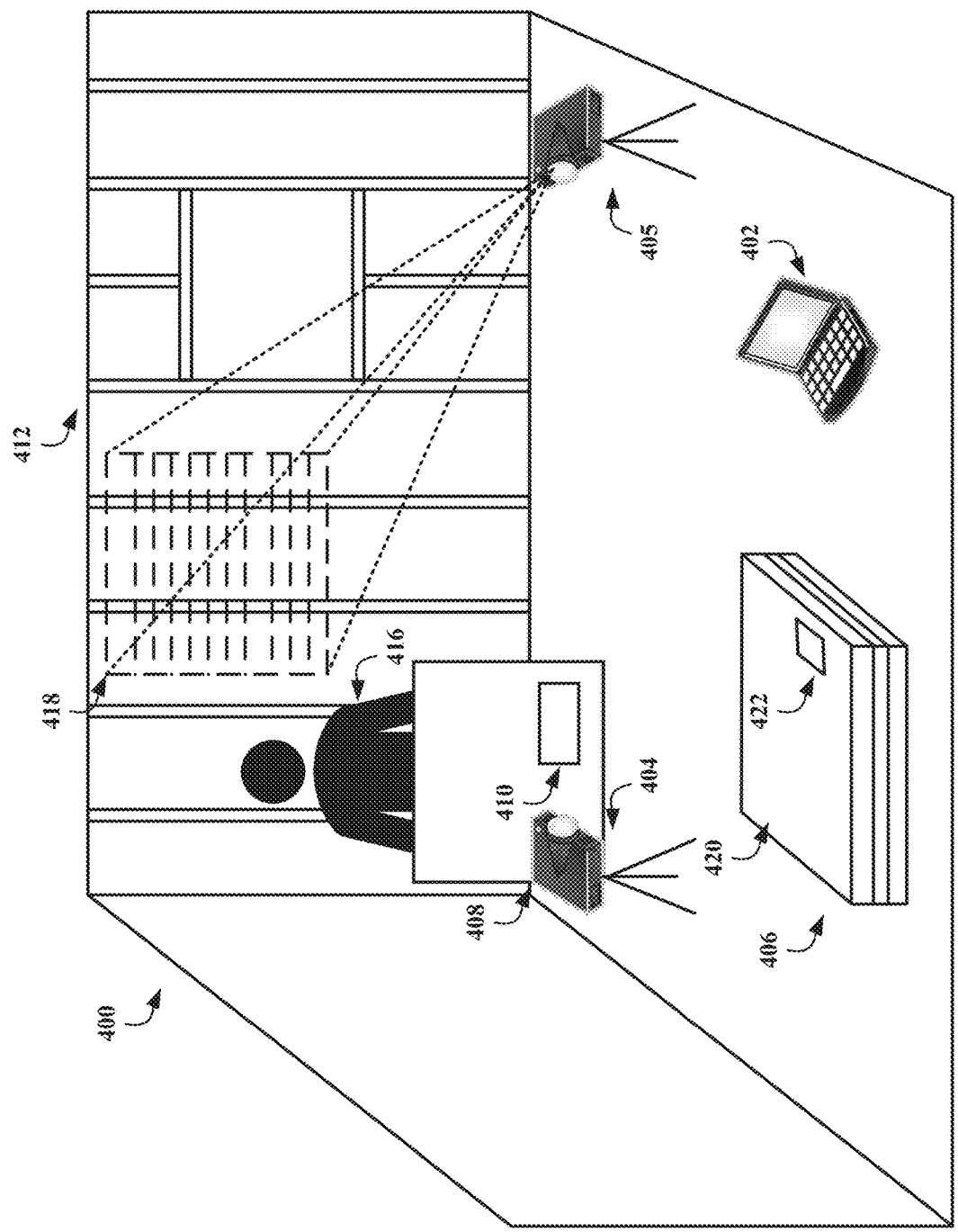
Figure 4G:
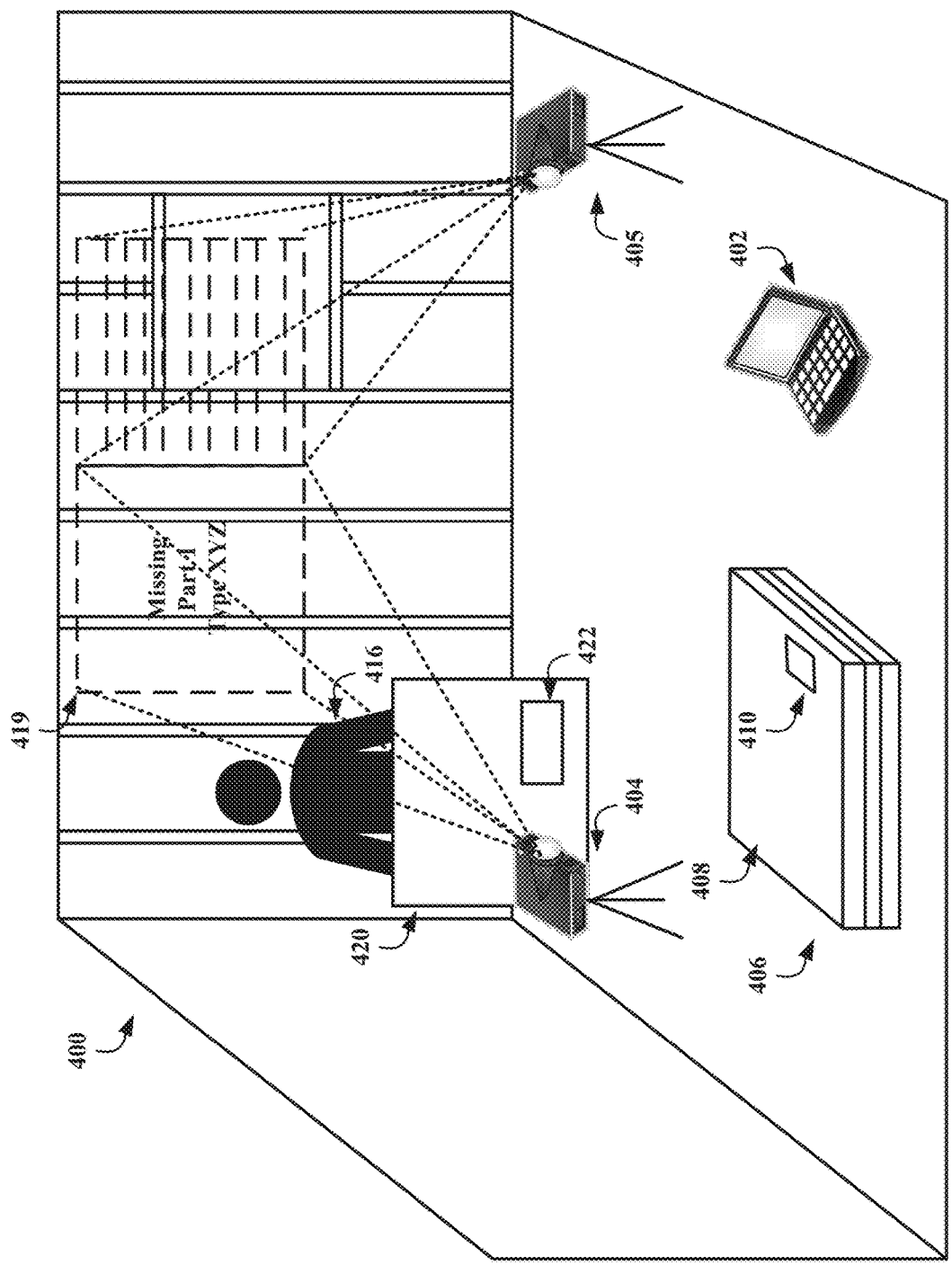

For example, as illustrated in FIG. 4G, the user 416 can select a prefab panel 420 that is not the current prefab panel in the installation order, as determined from the visual indicator 422. In response, in addition to displaying the installation graphic, the installation assistance system (the computer system 402 and the machine vision devices 404 and 405) can display missing graphics 419 at an installation location where the missing prefab panel would be installed. The missing graphics can include an indication that the graphic represents the missing prefab panel and details of the missing prefab panel, e.g., order number in the installation order, prefab panel type, etc. The missing graphics can be utilized by the user 416 to ensure that the prefab panel is aligned correctly and the missing prefab panel can be installed later correctly.

In 318, installation graphics are generated and displayed at the location matching the prefab part identification. In some implementations, the installation assistance system determines the installation position from the installation plan based on the prefab parts order position. In some implementations, based on the location, the installation assistance system generates installation graphics that accurately represent the prefab part being installed. For example, once the orientation of the construction site is determined, the computer system 402 can be retrieve the installation plan and to map the location of the machine vision devices 404 and 405 to the installation plan. Based on this, as the prefab parts 408 are selected for installation, the computer system 402 can generate the installation graphics 418 that visually represent the prefab panel 408 according to the installation location and the location of the machine vision devices 404 and 405. The, the computer system 402 can provide the installation graphics 418 to the machine vision devices 404 and 405, and instruct the machine vision devices 404 and 405 to display the installation graphics 418.

For example, as illustrated in FIG. 4E, the machine vision device 404 can project installation graphics 418 at an installation location matching a location in the installation plan. The installation graphic can include a visual representation of the prefab panel being installed. The installation graphic can also include details of the prefab panel being installed, e.g., order number in the installation order, prefab panel type, etc.

Figure 4H:
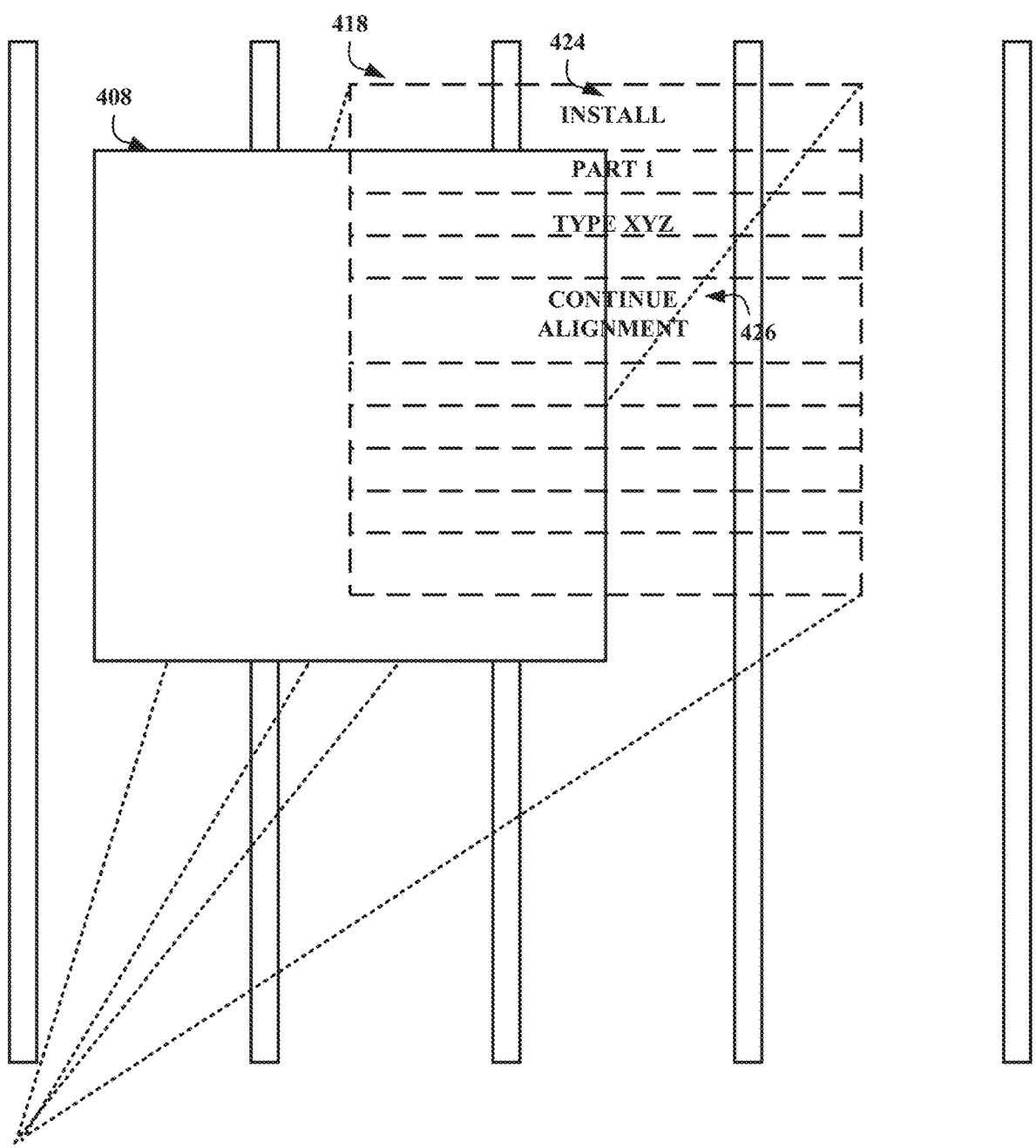

In some implementations, the installation assistance system (the computer system 402 and the machine vision devices 404 and 405) can determine which machine device to utilize to project the installation graphics. For example, the installation assistance system can determine which of the machine vision devices to utilize that does not interfere with the user installing the prefab panel. As illustrated in FIG. 4E, the installation assistance system can determine that the user 416 is standing closer to the machine vision device 405 and can potentially block the projection from the machine vision device 405. In response, the computer system 402 can determine and select to project the installation graphics 418 from the machine vision device 404. As illustrated in FIG. 4F, the installation assistance system can determine that the user 416 is standing closer to the machine vision device 404 and can potentially block the projection from the machine vision device 404. In response, the computer system 402 can determine and select to project the installation graphics from the machine vision device 405. Additionally, as the user installs the prefab panel, the installation assistance system can switch between the machine vision devices as the user moves around the room to avoid interference. In other implementations, installation graphics 418 may be displayed in AR, VR, or in a virtual environment displayed on a computer, In 320, it is determined if the placement of the prefab part is correct. If the placement is not correct, in 322 the display of the installation graphic is continued and method 300 return to 320. For example, as illustrated in FIG. 4H, the installation graphics 418 are continually displayed until the prefab panel 408 is properly aligned. The installation graphics 418 can include text that assists the user in installing the prefab panel 408, such as text "install" 424 and text "continue alignment" 426. To determine if the alignment is correct, the machine vision devices 404 and 405 can continually scan the room 400 to determine whether the prefab panel 408 is properly aligned.

Figure 4I:
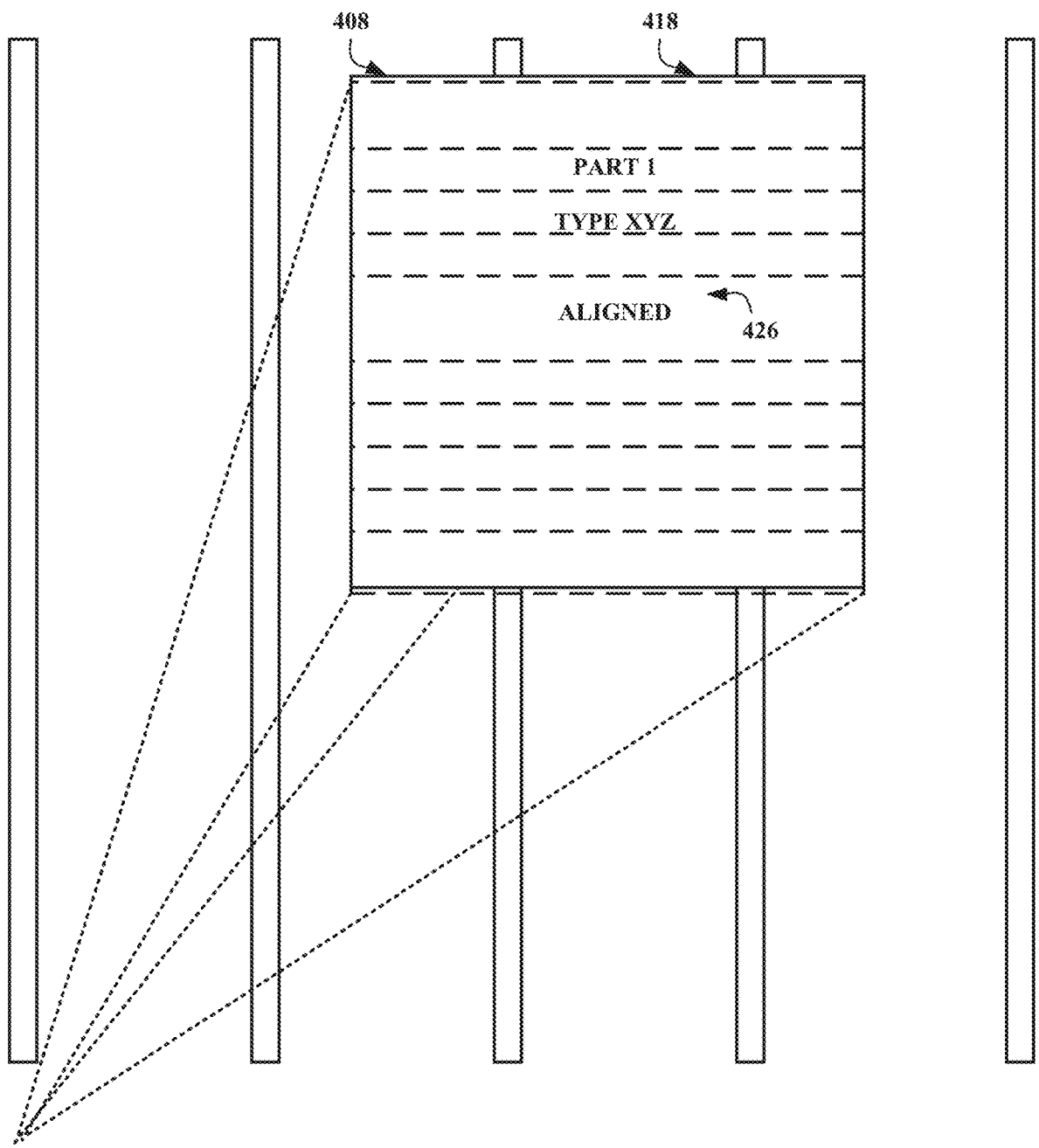
Figure 4J:
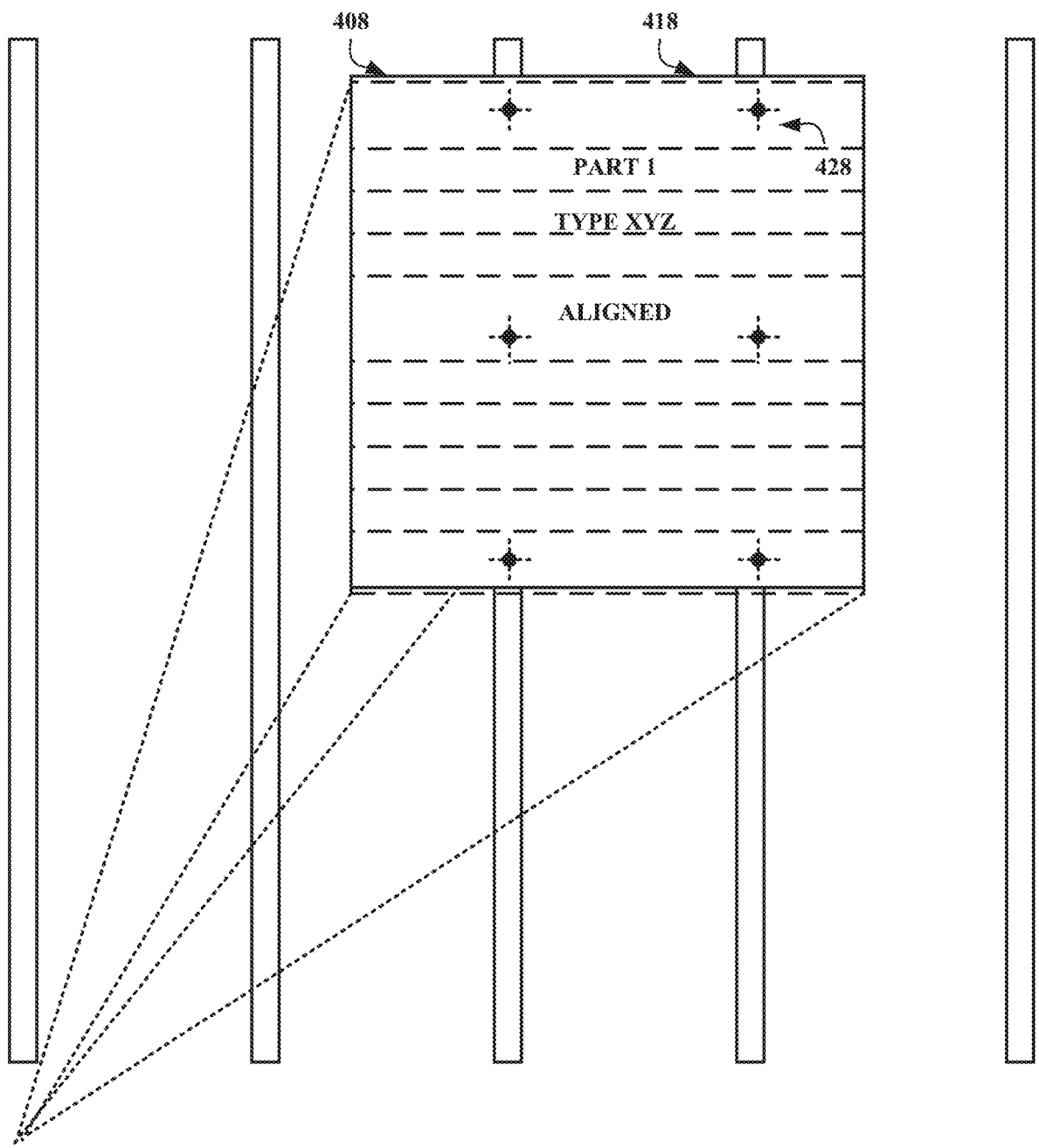

If the placement is correct, in 324, a graphic of correct placement is displayed. In some embodiments, the graphic of correct placement can be any type of visual indication that the placement is correct. For example, as illustrated in FIG. 4I, the installation graphics 418 can be changed to indicate that the prefab panel 408 is properly aligned. The installation graphics 418 can include text that indicates alignment, such as text "aligned" 426. To determine if the alignment is correct, the machine vision devices 404 and 405 can continually scan the room 400 to determine whether the prefab panel 408 is properly aligned.

Additionally, other visualization can be utilized to indicate that alignment is correct. For example, during the alignment, the installation graphic can be displayed in one color, e.g., red. Once the alignment is correct, the installation graphic can change color, e.g., green, to indicate proper alignment. Other indication can be utilized to indicate proper alignment such as sound notifications.

In 326, a graphic of connector locations can be optionally displayed. For example, as illustrated in FIG. 4I, once the prefab panel 408 is properly aligned, the installation graphics 418 can be changed to include visual guides for the location of connectors, e.g., screws, nails, etc.

In 328, it is determined whether the installation of the prefab part is complete. If the installation is not complete, the method 300 return to 328. In the installation is complete, in 322, it is determined whether more prefab parts remain to be installed. If more prefab parts remain, the method 300 returns to 306. If no prefab parts remain, in 334, it is determined whether additional parts are needed. If no additional parts are needed, method 300 can end or return to any stage. If additional parts are needed, the method 300 proceeds to 354.

As illustrated in FIG. 3B, in 350, it is determined whether an existing prefab part is altered. For example, the computer system 402 (or the user 402) can determine to alter one of the prefab panels 408 from the queue 406. If an existing prefab part is altered, in 352, the prefab part may optionally be delivered to a factory for alteration. In other embodiments, the alteration may be performed at the construction site.

If an existing prefab part is not used in the alteration, in 354, a new prefab part is selected that matches the part type of the prefab part to be altered. For example, the installation assistance system can transmit the part type of the prefab part to the factor that requires alteration.

In 356, the location of the prefab part requiring alteration is scanned. For example, the computer system 402, in coordination with the machine vision devices 404 and 405, can scan the installation location. For example, similar to the orientation determination, the computer system 402 can instruct the machine vision devices 404 and 405 to project a predefined pattern at the installation location and capture one or more images of the installation location. In some embodiment, other types of system can be used to scan the installation location, such as LIDAR.

In 358, dimensions of the alteration of the prefab part are calculated. In some embodiment, the installation assistance system can analyze the captured images of the installation location to determine the dimensions of the alteration. For example, referring to FIG. 4G, the prefab panel 420 may partially overlap a window location and require alteration to expose the window. Based on the projection of a patter at the installation location, the computer system 402 can perform image analysis on the captured images of the predefined pattern to calculate the alteration to the prefab panel 420.

In 360, the specification of the alteration are transmitted to the tools performing the alteration, which may be located at a factory or on-site. In some embodiments, the installation assistance system can generate a specification in a format readable by the tools of the factory or on-site location.

In 362, it is determined whether material is removed or added. If material is added, in 364, an addition is printed to match dimension of the alteration. If material is removed, in 366, the prefab part is cut to match in the dimensions of the alteration. In 368, finishing can optionally be performed. In 370, if the prefab part was altered at a factory, then the altered prefab part is delivered to the construction site. The method 300 then proceeds to 316. A complete description of the alteration process can be found in U.S. Provisional application Ser. No. _____ entitled "Systems and Methods for Automating the Manufacture of Customized Prefabricated Parts Using Electromagnetic Image Surveying" to Huh and filed on the same day as the instant application, the entire contents of which are incorporated herein by reference.

Figure 5A:
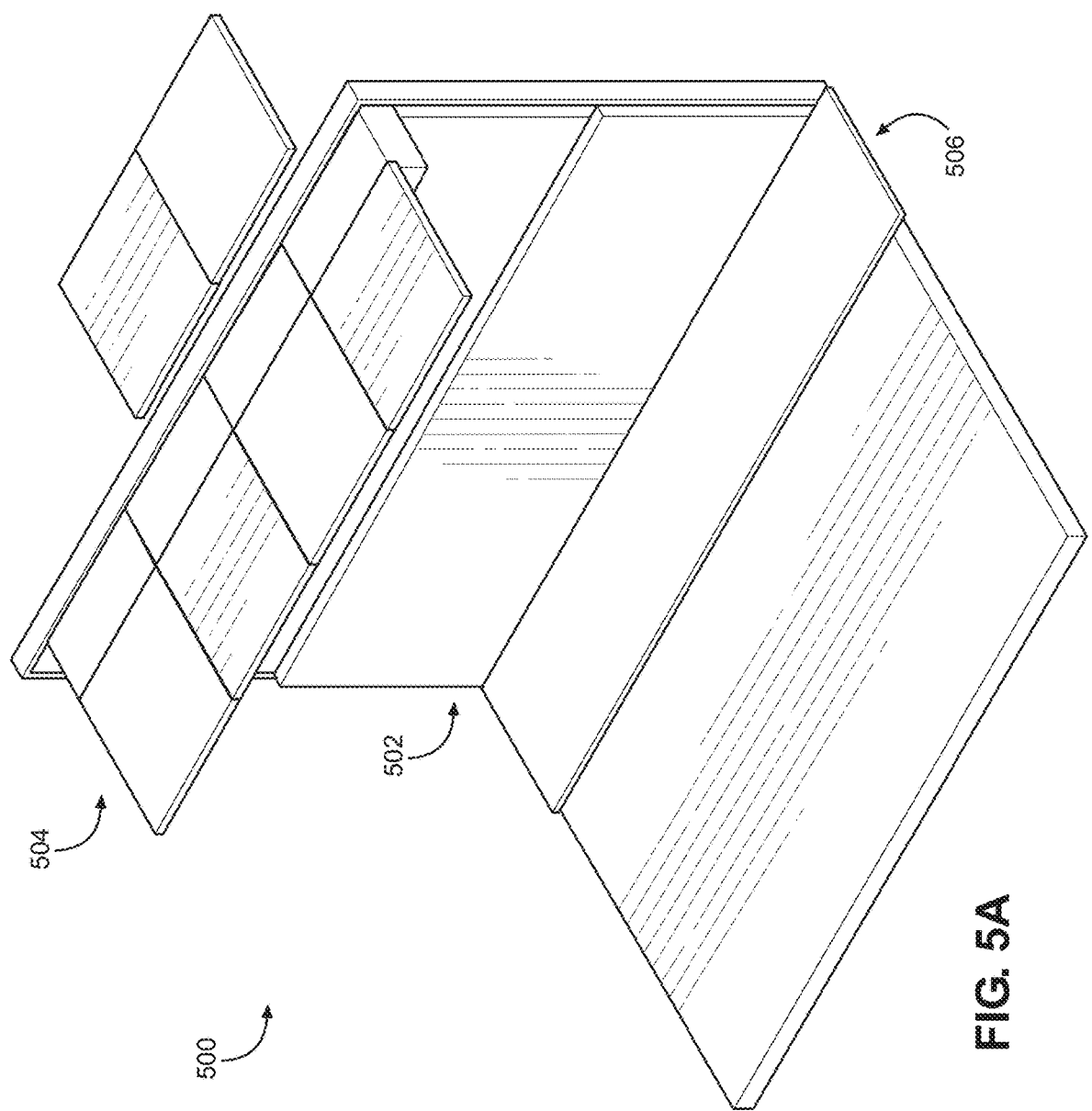
FIG. 5A-5D illustrate examples of several views of different types of prefab part that can be installed at a construction site, according to various implementations.
Figure 5B:
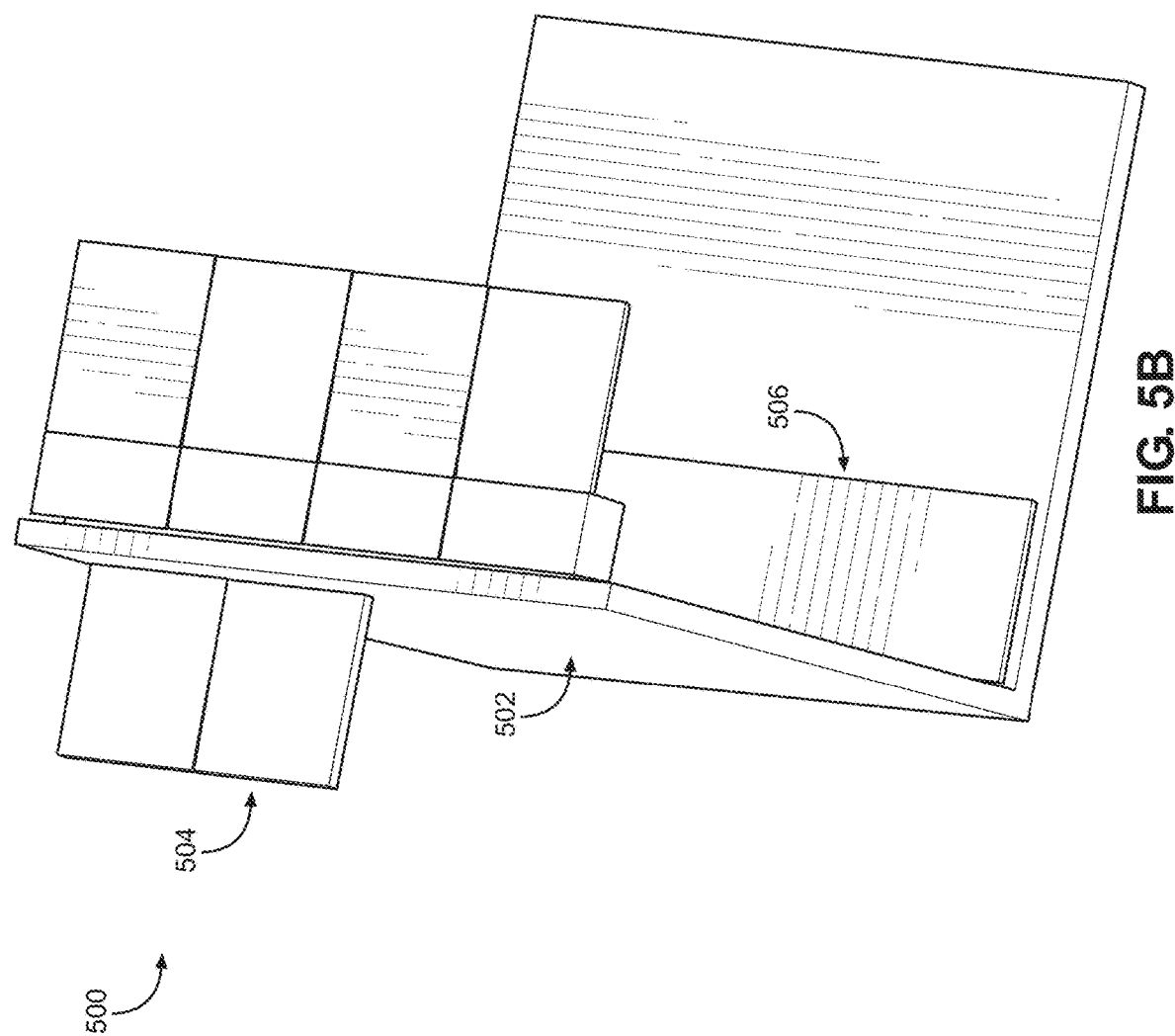

As discussed above, the installation assistance system can be utilized to install different types of prefab parts. FIG. 5A-5D illustrate several views of different types of prefab part that can be installed at a construction site 500 according to various implementations. As illustrated in FIG. 5A, the construction site 500 can be include prefab wall panel 502, prefab ceiling panels 504, and prefab floor panels 506. As illustrated in FIG. 5A-5D, the prefab wall panel 502, prefab ceiling panels 504, and prefab floor panels 506 can be manufactured as modular units that are installed using the installation assistance system and methods 200 and 300 described above. In the method 200 and 300 described above, the installation plan can include several three dimensional model of the construction site 500 similar to the views illustrated in FIG. 5A-5D.

Figure 6A:
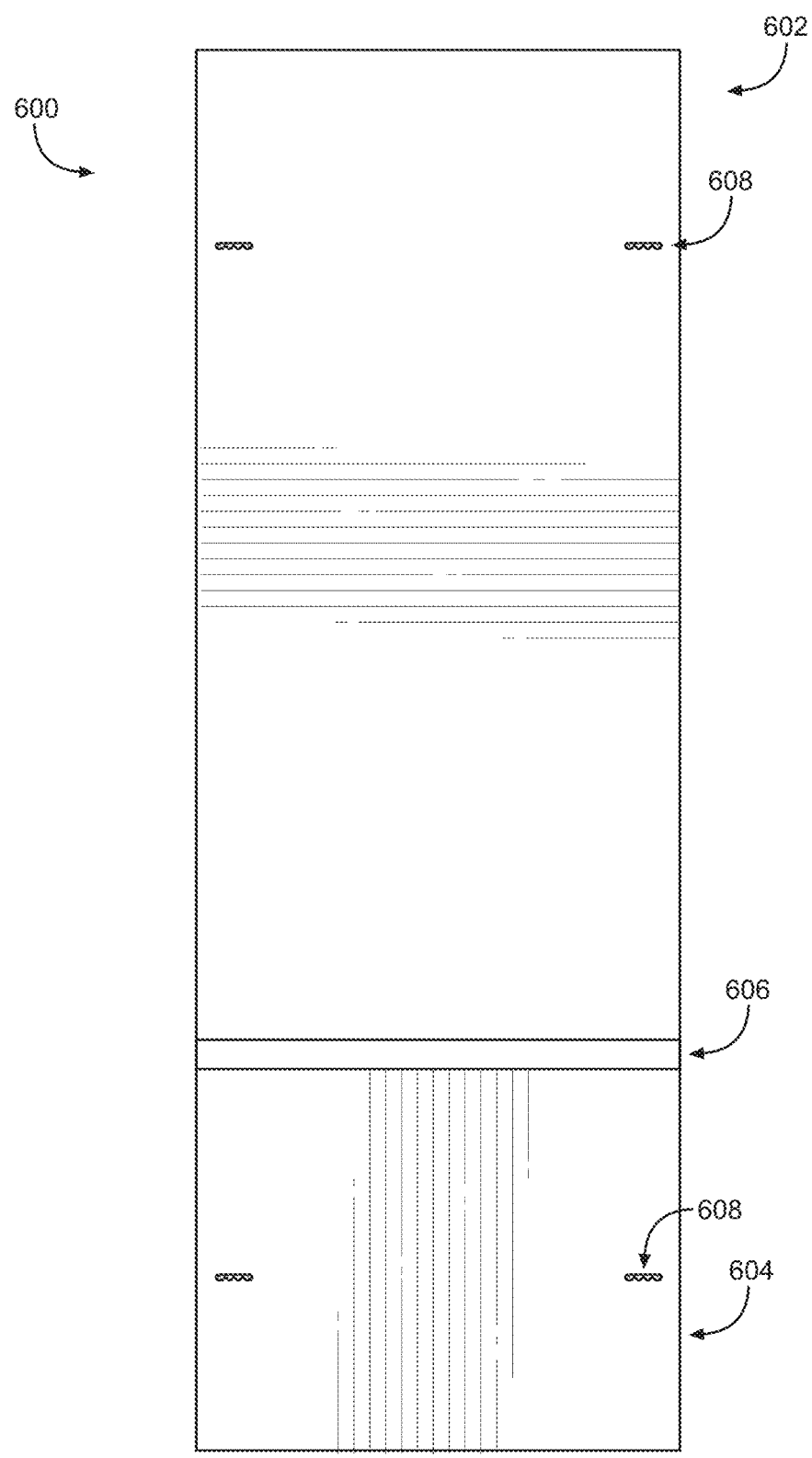
FIGS. 6A-6C illustrate an example of a prefab panel, according to various implementations.
Figure 6B:
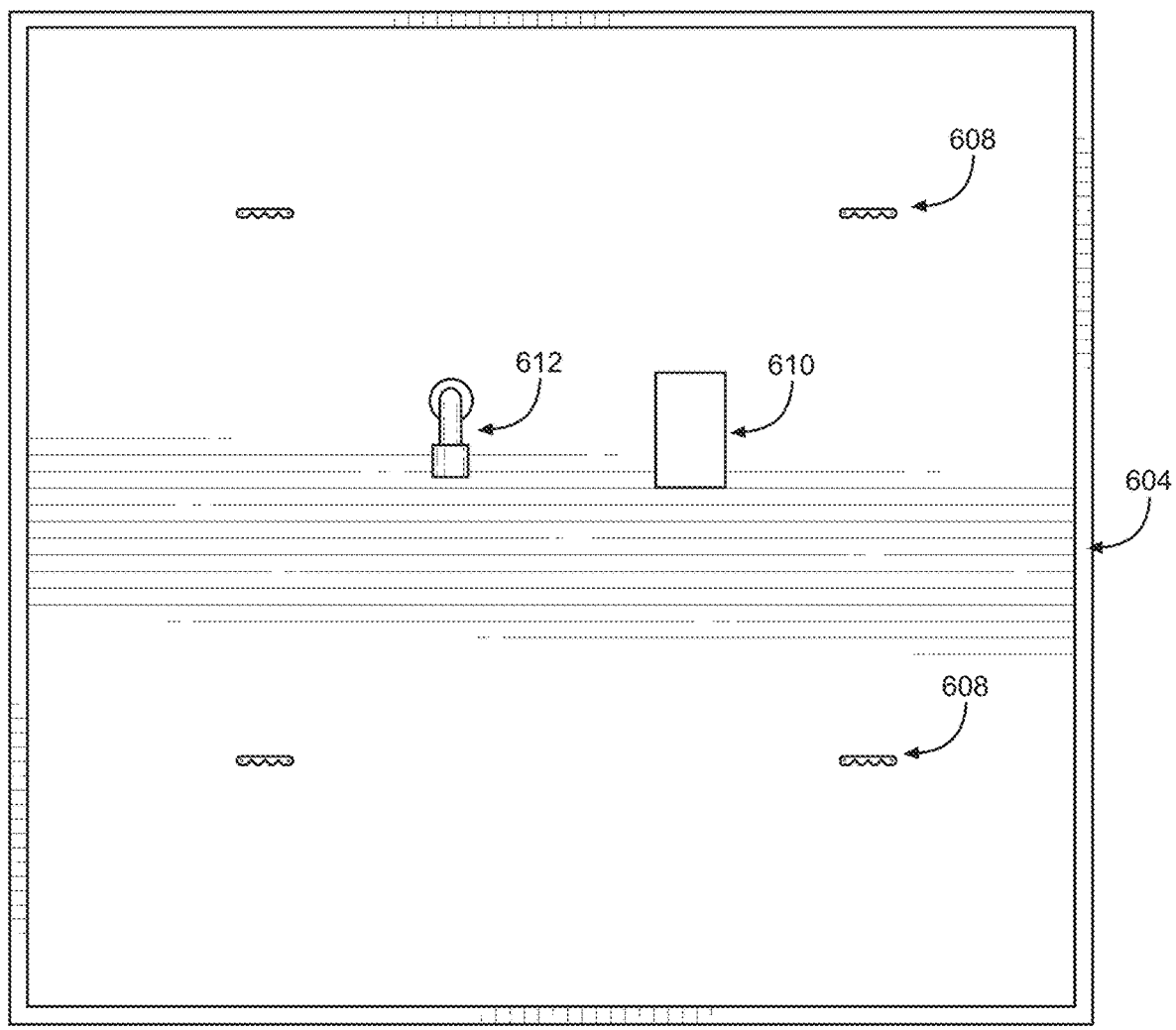
Figure 6C:
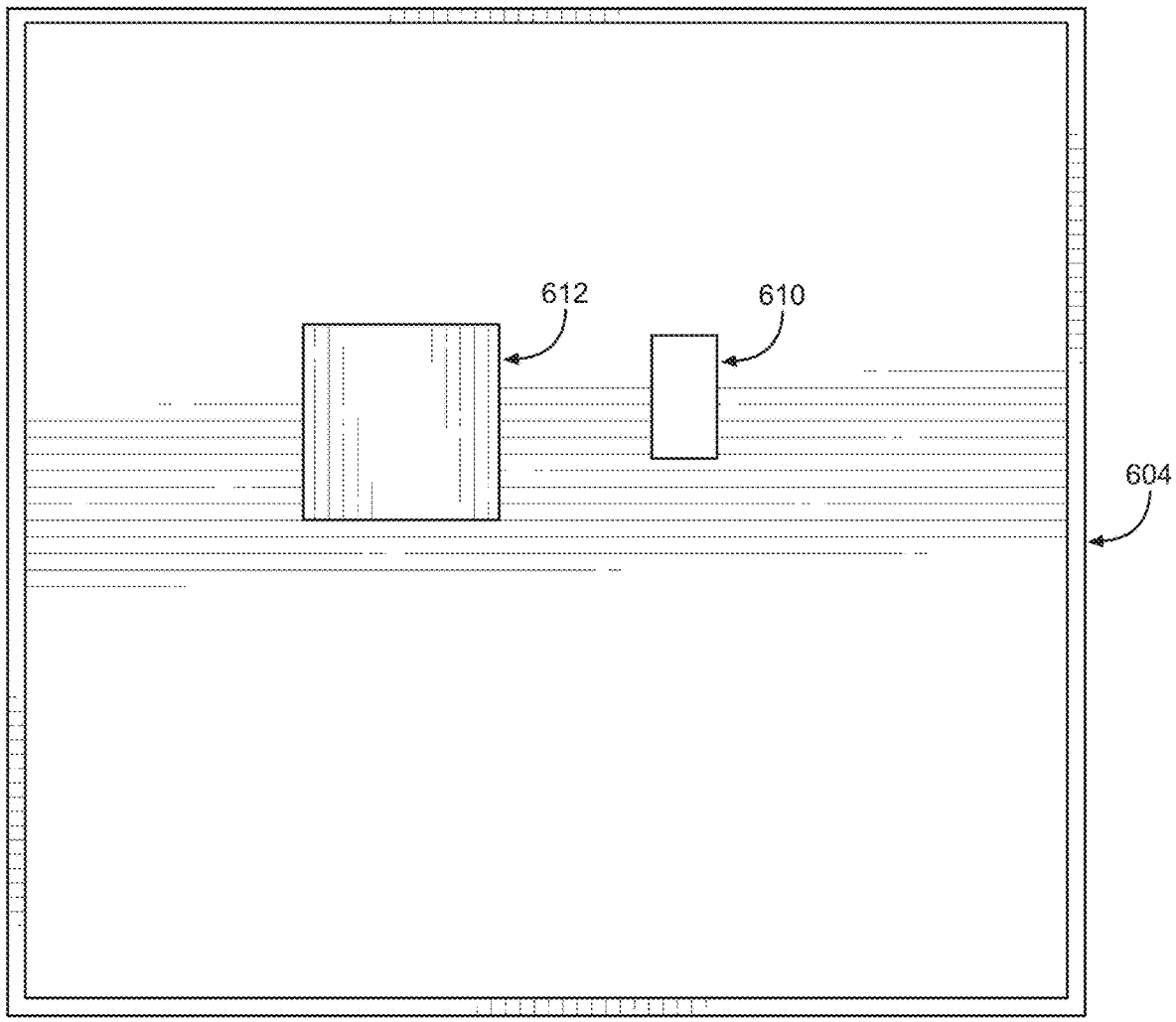

FIGS. 6A-6C illustrate an example of a prefab panel 600, which can be installed using the method described above, according to various implementations. FIG. 6A illustrates a rear view of the prefab panel 600. The prefab panel 600 includes a wall panel portion 602 and a base panel portion 604. The wall panel portion 602 can be connected to the base panel portion by a connecting strip 606. To install the prefab panel 600, the prefab panel 600 includes hangers 608. The hangers 608 are configured to engage with one or more rails installed on structural elements at a construction site. The prefab panel can be constructed of any type of construction material, e.g., wood, gypsum board, plater, paper, metal, plastics, and combination thereof.

FIG. 6B illustrates a rear view of the base panel portion 604, and FIG. 6C illustrates a front view of the base panel portion 604. In addition to the hangers 608, the base panel portion 604 includes one or more premanufactured construction elements. For example, the base panel portion 604 can include an electrical knockout 610 and a plumbing knockout 612. The electrical knockout 610 is positioned at a location of electrical fixtures or components, such as an electrical outlets, switch outlets, wiring boxes, conduit, etc. The plumbing knockout 612 is positioned at a location of plumbing fixtures or components, such as a pipe location, faucet, drain, etc. One skilled in the art will also realize that the wall panel portion 602 can also include premanufactured construction elements.

Figure 5C:
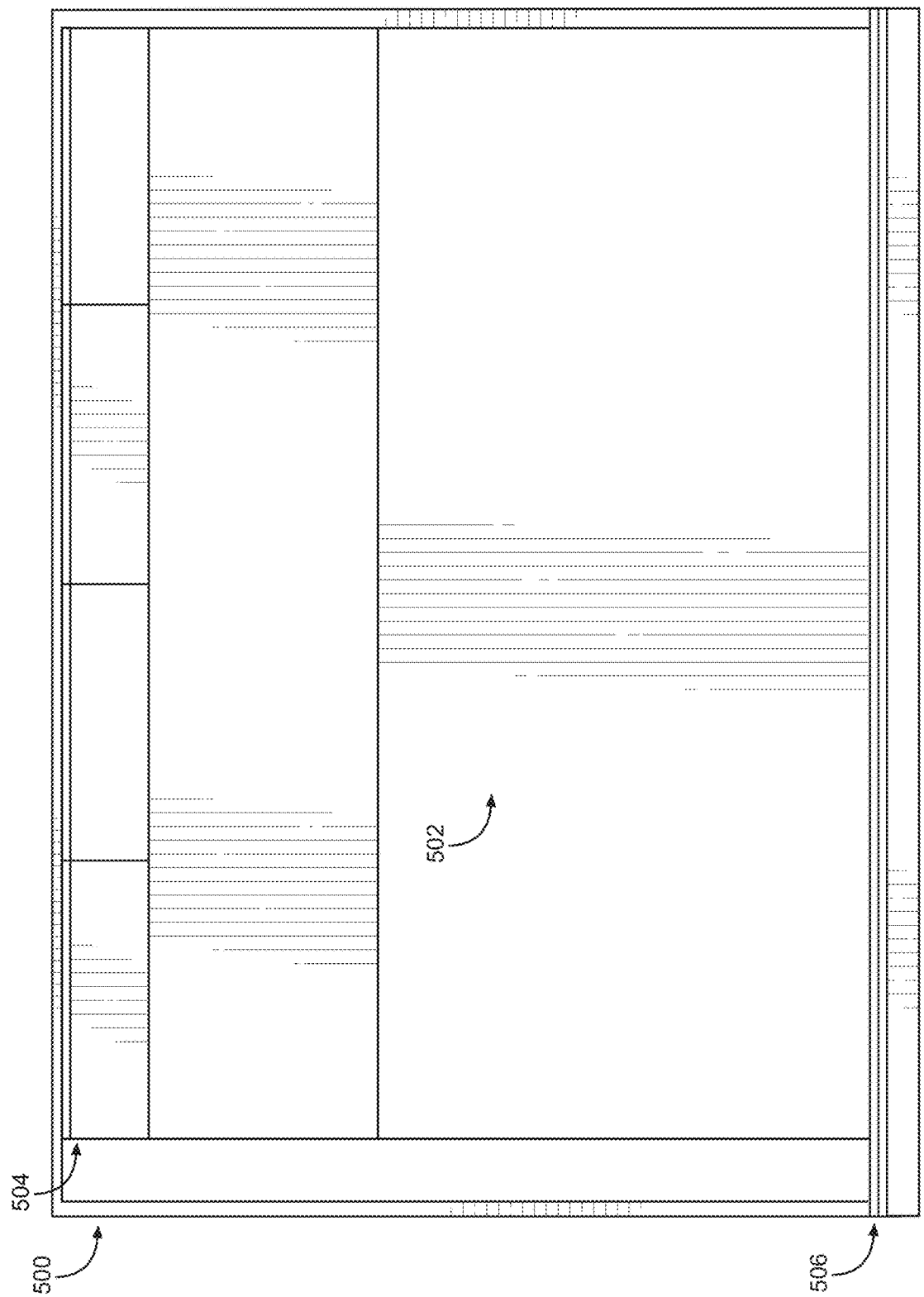
Figure 5D:
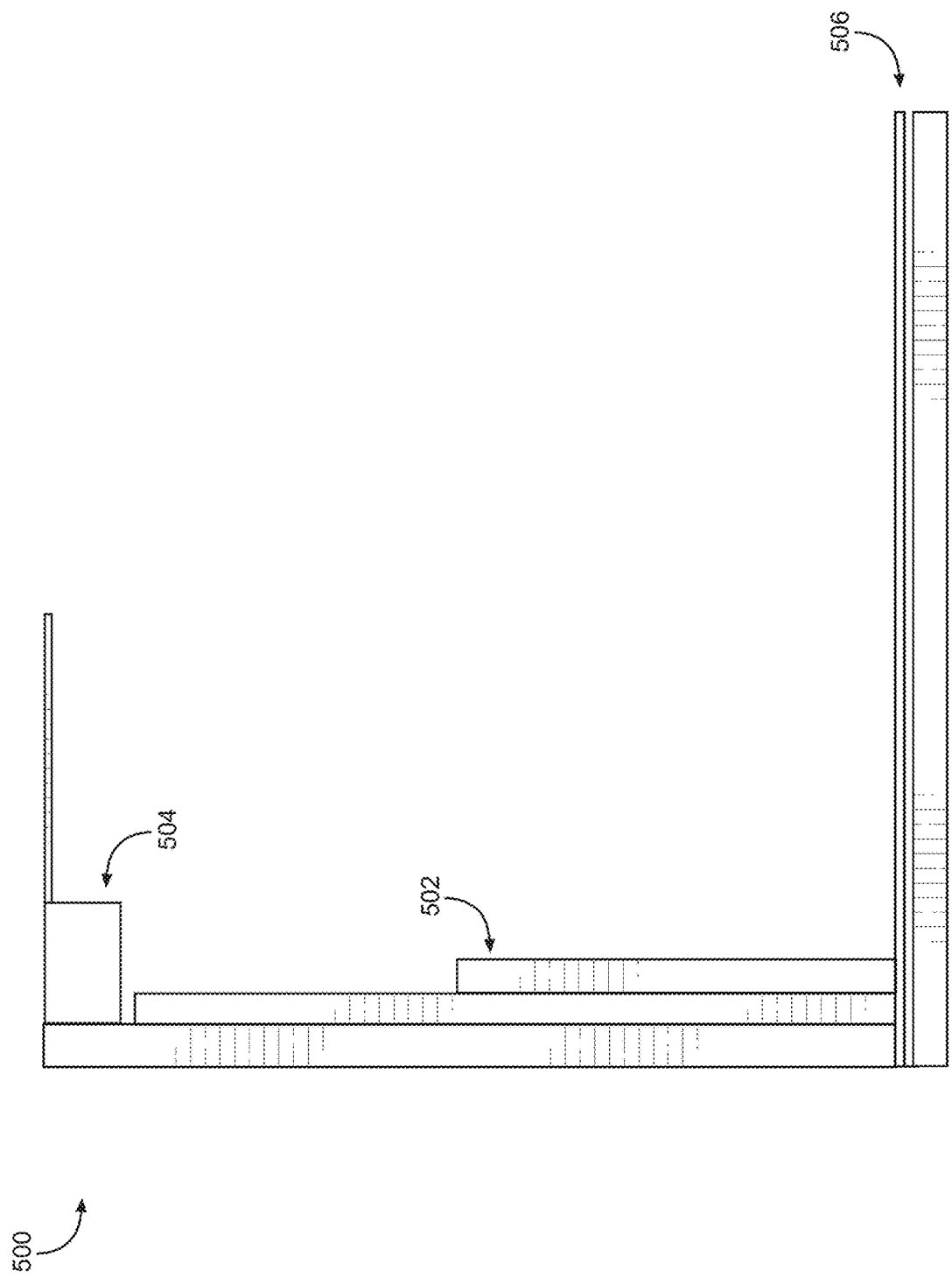
Figure 7A:
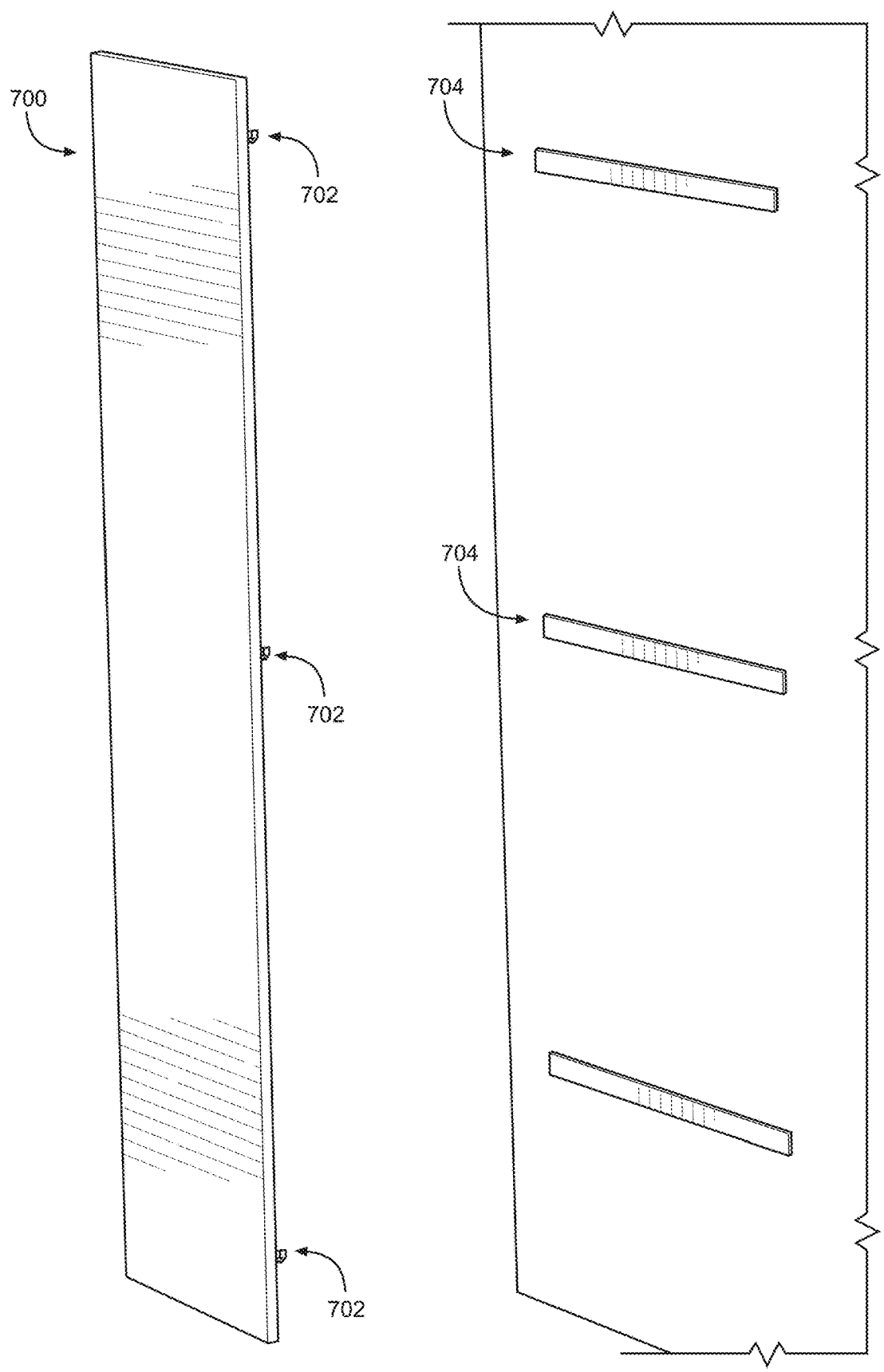
FIGS. 7A-7C illustrate an example of a method for installing a prefab panel, according to various implementations.
Figure 7B:
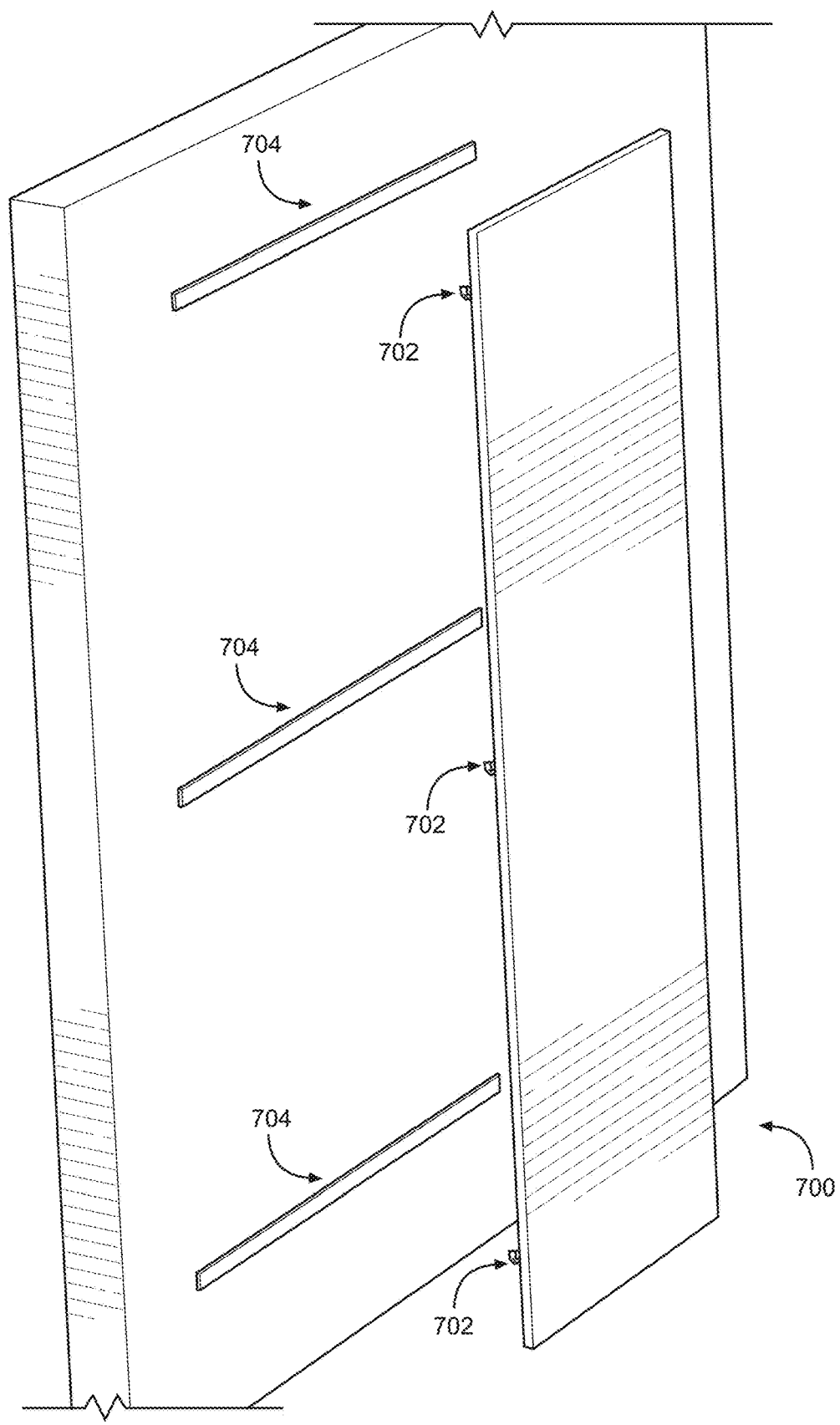
Figure 7C:
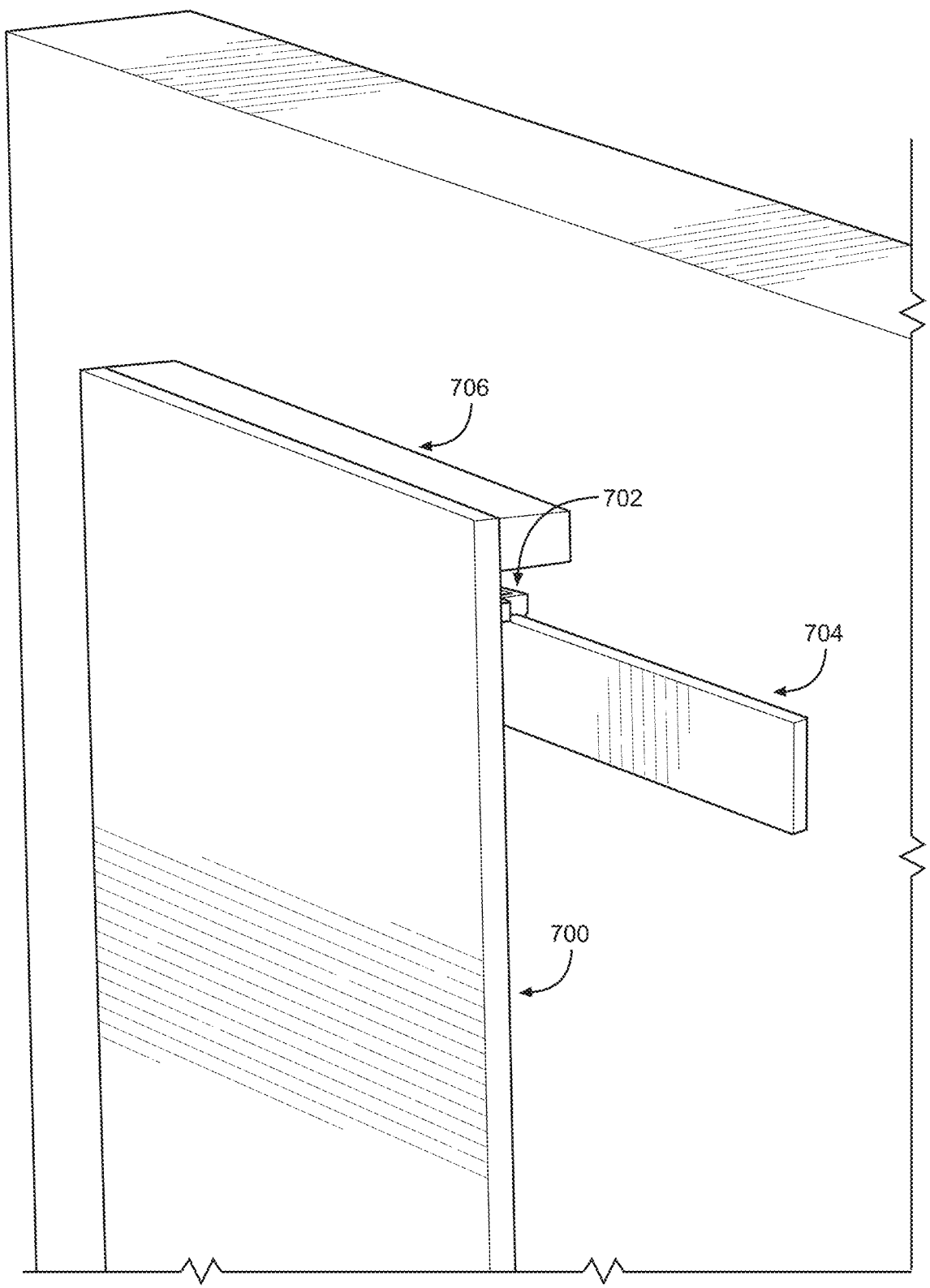

FIGS. 7A-7C illustrate an example of a method for installing a prefab panel 700, for example, prefab panel 600 described above. As illustrated in FIGS. 7A and 7B, the prefab panel 700 include one or more hangers 702 that are positioned to engage with one or more rails 704. The rails 504 include a lip that engages with the lip of the hangers 702. The rails 704 are affixed to a structural member (e.g., a wall). As illustrated in FIG. 5C, the prefab panel 700 are hung by lifting the prefab panel 700 to align the hangers 702 with the rails 704 and engaging the hangers 702 with the rails 704. The prefab panel 700 can also include a support member 706. The support member 706 provides support between the prefab panel 700 and the wall to prevent flex in the prefab panel 700. In implementation, the installation assistance system and methods described above can be utilized to assist in the installation of the rails 704 and the installation of the prefab panel 700 on the rails 704.

An electrical and plumbing system can be installed at a construction site according to various implementations. The electrical system can include various prefab parts, such as electrical wiring conduits, junction boxes, and fixtures. Likewise, the plumbing system can include various prefab parts, such as piping and fixture connectors. The prefab parts can be constructed to allow for a minimum amount of installation by a user. For example, the electrical wiring conduits and junction boxes can be preinstalled with wiring. In implementations, the installation assistance system can be utilized in the installation of the electrical and plumbing system using the method described above. For example, when installing the electrical system, the installation assistance system can determine and project the installation of the various prefab parts, such as electrical wiring conduits, junction boxes, and fixtures.

Figure 8:
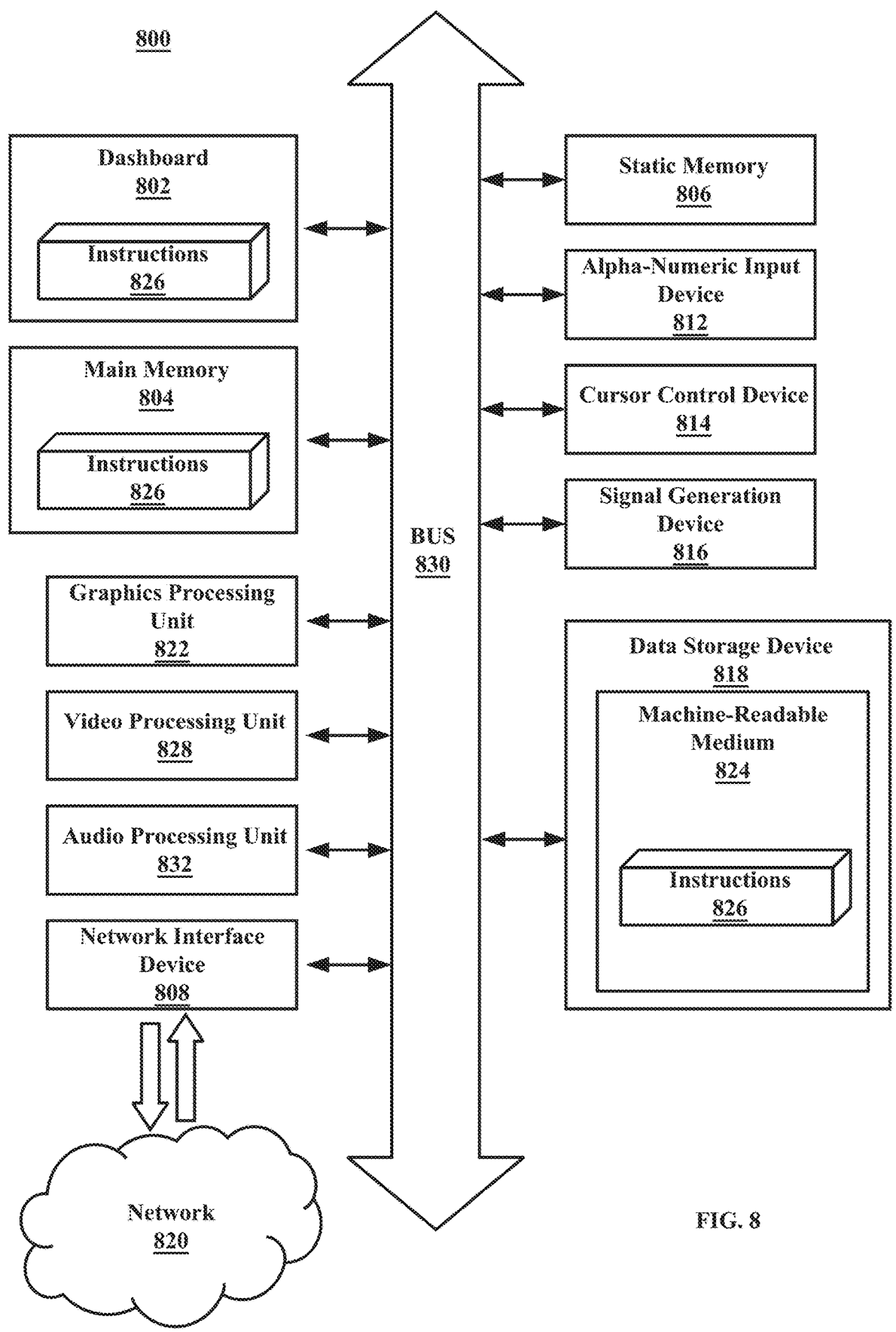
FIG. 8 illustrates an example of a computer system, according to various implementations.

FIG. 8 illustrates an example machine of a computer system within which a set of instructions, for causing the machine to perform any one or more of the methodologies discussed herein, can be executed. In implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" also includes any collection of machines that individually or jointly execute a set (or multiple sets) of instructions to perform any one or more of the methodologies discussed herein.

The computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage device 818, which communicate with each other via a bus 830.

The processing device 802 represents one or more general-purpose processing devices such as a microprocessor, a central processing unit, or the like. For example, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. The processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein.

The computer system 800 further includes a network interface device 808 to communicate over the network 820. The computer system 800 also includes a video display unit 810 (e.g., a liquid crystal display (LCD) or a cathode ray tube (CRT)), an alphanumeric input device 812 (e.g., a keyboard), a cursor control device 815 (e.g., a mouse), a graphics processing unit 822, a signal generation device 816 (e.g., a speaker), graphics processing unit 822, video processing unit 828, and audio processing unit 832.

The data storage device 818 can include a machine-readable storage medium 824 (also known as a computer-readable medium) on which is stored one or more sets of instructions or software 826 embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media.

In implementations, the instructions 826 include instructions to implement functionality corresponding to the components of a device to perform the disclosure herein. While the machine-readable storage medium 824 is shown in an example implementation to be a single medium, the term "machine-readable storage medium" includes a single medium or multiple media (e.g., a centralized or distributed database, and/or associated caches and servers) that store the one or more sets of instructions. The term "machine-readable storage medium" also includes any medium that is capable of storing or encoding a set of instructions for execution by the machine and that cause the machine to perform any one or more of the methodologies of the present disclosure. The term "machine-readable storage medium" also includes, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "calculating" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices. Furthermore, to the extent that the terms "including", "includes", "having", "has", "with", or variants thereof are used in the detailed description, such terms are intended to be inclusive in a manner similar to the term "comprising." As used herein, the terms "one or more of" and "at least one of" with respect to a listing of items such as, for example, A and B, means A alone, B alone, or A and B. Further, unless specified otherwise, the term "set" should be interpreted as "one or more." Also, the term "couple" or "couples" is intended to mean either an indirect or direct connection. Thus, if a first device couples to a second device, that connection can be through a direct connection, or through an indirect connection via other devices, components, and connections.

The present disclosure also relates to an apparatus for performing the operations herein. This apparatus can be specially constructed for the intended purposes, or it may comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), erasable programmable read-only memories (EPROMs), electrically erasable programmable read-only memories (EEPROMs), magnetic or optical cards, flash memory devices, or any type of media suitable for storing electronic instructions, each coupled to a computer system bus. Examples of implementations of the present disclosure can also be provided as a computer program product, or software, that may include a machine-readable medium having stored thereon instructions, which can be used to program a computer system (or other electronic devices) to perform a process according to the present disclosure.

Various general purpose systems can be used with programs in accordance with the teachings herein, or a more specialized apparatus can be utilized to perform the method. Examples of the structure for a variety of systems appear in the description above. In addition, the present disclosure is not described with reference to any particular programming language. It will be appreciated that a variety of programming languages may be used to implement the teachings of the disclosure as described herein.

A number of implementations have been described. Nevertheless, it will be understood that various modifications can be made without departing from the spirit and scope of the invention. In addition, the logic flows depicted in the figures do not require the particular order shown, or sequential order, to achieve desirable results. In addition, other steps can be provided, or steps may be eliminated, from the described flows, and other components can be added to, or removed from, the described systems. Accordingly, other implantations are within the scope of the following claims.

What is claimed is:

1. A method for automating installation of prefabricated parts at a construction site, the method comprising:
   retrieving an installation plan for a room in which a plurality of parts are installed,
      wherein the installation plan comprises an installation location for each of the plurality of parts and an installation order of the plurality of parts, and
      wherein each of the plurality of parts comprises a visual indicator indicating an order position in the installation order;
   determining an orientation of the room based on one or more images captured for the room;
   scanning a first visual indicator on a first part from the plurality of parts, the visual indicator indicating a first order position in the installation order;
   determining whether the first order position from the first visual indicator matches a current order position in the installation order;
   in response to the first order position matching the current order position, determining a first installation location in the room based on the first order position and the installation plan; and
   displaying an installation graphic at the first installation location in the room, the installation graphic illustrating a spatial position and an alignment for the first part.

2. The method of claim 1, wherein the installation graphic comprises an image corresponding to a size and shape of the first part.

3. The method of claim 1, the method further comprising:
   updating, in real-time, the installation graphic with a visual indication of a correct spatial position and alignment of the first part.

4. The method of claim 1, the method further comprising:
   determining an installer location corresponding to a spatial location of an installer in the room; and
   selecting one or more projectors to display the installation graphic based on the installer location, wherein the one or more projectors are selected to avoid interference by the installer in displaying the installation graphic.

5. The method of claim 1, the method further comprising:
   determining that the first order position from the first visual indicator does not match the current order position in the installation order; and
   providing notification that the first order position does not match the current position.

6. The method of claim 5, the method further comprising:
   determining a second part that corresponds to the current order position in the installation order;
   determining, for the second part, a second installation location in the room based on the installation plan; and
   displaying an missing part graphic at the second installation location in the room, the missing part graphic illustrating a spatial position and an alignment for the second part.

7. The method of claim 6, wherein the missing part graphic is displayed simultaneously with the installation graphic.

8. The method of claim 1, the method further comprising:
   determining that the first part requires alteration based on the orientation of the room and a configuration of the first part; and
   determining specifications of the alteration based on the configuration of the first part and one or more spatial positions and alignments of additional parts that are located adjacent to the first installation location of the first part.

9. The method of claim 8, wherein the alteration comprises one or more of an addition of material to the first part and a removal of material from the first part.

10. The method of claim 1, the method further comprising:
    after installation of the first part, scanning the first visual indicator of the first part; and
    confirming that the first part is correctly installed based on first visual indicator and the installation plan.

11. A system for automating installation of prefabricated parts at a construction site, the system comprising:
    one or more projectors;
    one or more cameras; and
    a processing unit coupled to the one or more projectors and the one or more cameras, the processing unit executing instructions for performing a method comprising:
       retrieving an installation plan for a room in which a plurality of parts are installed,
          wherein the installation plan comprises an installation location for each of the plurality of parts and an installation order of the plurality of parts, and
          wherein each of the plurality of parts comprises a visual indicator indicating an order position in the installation order;
       determining an orientation of the room based on one or more images captured by the one or more cameras for the room;
       scanning, using the one or more cameras, a first visual indicator on a first part from the plurality of parts, the visual indicator indicating a first order position in the installation order;
       determining whether the first order position from the first visual indicator matches a current order position in the installation order;
       in response to the first order position matching the current order position, determining a first installation location in the room based on the first order position and the installation plan; and
    displaying, using the one or more projectors, an installation graphic at the first installation location in the room, the installation graphic illustrating a spatial position and an alignment for the first part.

12. The system of claim 11, wherein the installation graphic comprises an image corresponding to a size and shape of the first part.

13. The system of claim 11, the method further comprising:
    updating, in real-time using the one or more projectors, the installation graphic with a visual indication of a correct spatial position and alignment of the first part.

14. The system of claim 11, the method further comprising:
  determining, using the one or more cameras, an installer location corresponding to a spatial location of an installer in the room; and
  selecting at least one or the one or more projectors to display the installation graphic based on the installer location, wherein the one or more projectors are selected to avoid interference by the installer in displaying the installation graphic.

15. The system of claim 11, the method further comprising:
  determining that the first order position from the first visual indicator does not match the current order position in the installation order; and
  providing notification that the first order position does not match the current position.

16. The system of claim 15, the method further comprising:
  determining a second part that corresponds to the current order position in the installation order;
  determining, for the second part, a second installation location in the room based on the installation plan; and
  displaying, using the one or more projectors, an missing part graphic at the second installation location in the room, the missing part graphic illustrating a spatial position and an alignment for the second part.

17. The system of claim 16, wherein the missing part graphic is displayed simultaneously with the installation graphic.

18. The system of claim 11, the method further comprising:
  determining that the first part requires alteration based on the orientation of the room and a configuration of the first part; and
  determining, using the one or more cameras, specifications of the alteration based on the configuration of the first part and one or more spatial positions and alignments of additional parts that are located adjacent to the first installation location of the first part.

19. The system of claim 18, wherein the alteration comprises one or more of an addition of material to the first part and a removal of material from the first part.

20. The system of claim 11, the method further comprising:
  after installation of the first part, scanning, using the one or more cameras, the first visual indicator of the first part; and
  confirming that the first part is correctly installed based on first visual indicator and the installation plan.

* * * * *